United States Patent [19]
Hashimoto et al.

[11] Patent Number: 6,114,905
[45] Date of Patent: Sep. 5, 2000

[54] SIGNAL AMPLIFIER APPARATUS AND MAGNETIC DISK STORAGE APPARATUS USING THE SAME

[75] Inventors: Takashi Hashimoto, Ome; Yuji Nagaya, Owariasahi; Masaki Yoshinaga, Higashiyamato; Noriaki Hatanaka, Chigasaki; Tatsuo Mochizuki, Yokohama; Katsuya Sonoyama, Akishima, all of Japan

[73] Assignees: Hitachi, Ltd.; Hitachi ULSI Systems Co., Ltd., both of Tokyo; Hitachi Information Technology Co., Ltd., Kanagawa, all of Japan

[21] Appl. No.: 09/184,336

[22] Filed: Nov. 2, 1998

[30] Foreign Application Priority Data

Nov. 4, 1997 [JP] Japan ................................. 9-317691
Sep. 7, 1998 [JP] Japan ................................. 10-252998

[51] Int. Cl.[7] ........................ H03F 3/45; G11B 5/09; G11B 5/02
[52] U.S. Cl. ........................ 330/252; 330/253; 360/46; 360/67
[58] Field of Search .................... 330/252, 253; 360/46, 67, 68

[56] References Cited

U.S. PATENT DOCUMENTS 4,881,043 11/1989 Jason ........................ 330/252
5,323,278 6/1994 Contreras et al. ............. 360/67
5,712,739 1/1998 Nakamura et al. ............. 360/46

OTHER PUBLICATIONS

IEEE Journal of Solid–State Circuits, vol. 29, No. 2, Dec. 1994, "A 0.8nV/ Hz CMOS Preamplifier for Magneto–REsistive Read Elements", Hans W. Klein et al, pp. 1589–1595.

*Primary Examiner*—Robert Pascal
*Assistant Examiner*—Patricia T. Nguyen
*Attorney, Agent, or Firm*—Beall Law Offices

[57] ABSTRACT

A very-small-signal amplifier is capable of amplifying very small signals with high sensitivity up to high frequencies while simplifying the circuit, and a magnetic disk storage apparatus realizes a reading operation over a wide band up to high frequencies with high sensitivity. The signal amplifier is a modified differential circuit including a first transistor of a first conductivity type and a second transistor of a second conductivity type each having a control terminal, a terminal of the input side and a terminal of the output side. The terminals on the input side are connected in common, and a current corresponding to the voltage difference across the control terminals is allowed to flow. A very small voltage signal generated by an input signal source is applied to the control terminal of said first transistor. A bias voltage is applied to the control terminal of the second transistor. Therefore, an amplified signal corresponding to the very small voltage signal generated by the input signal source is generated at the terminal on the output side of the second transistor.

33 Claims, 20 Drawing Sheets

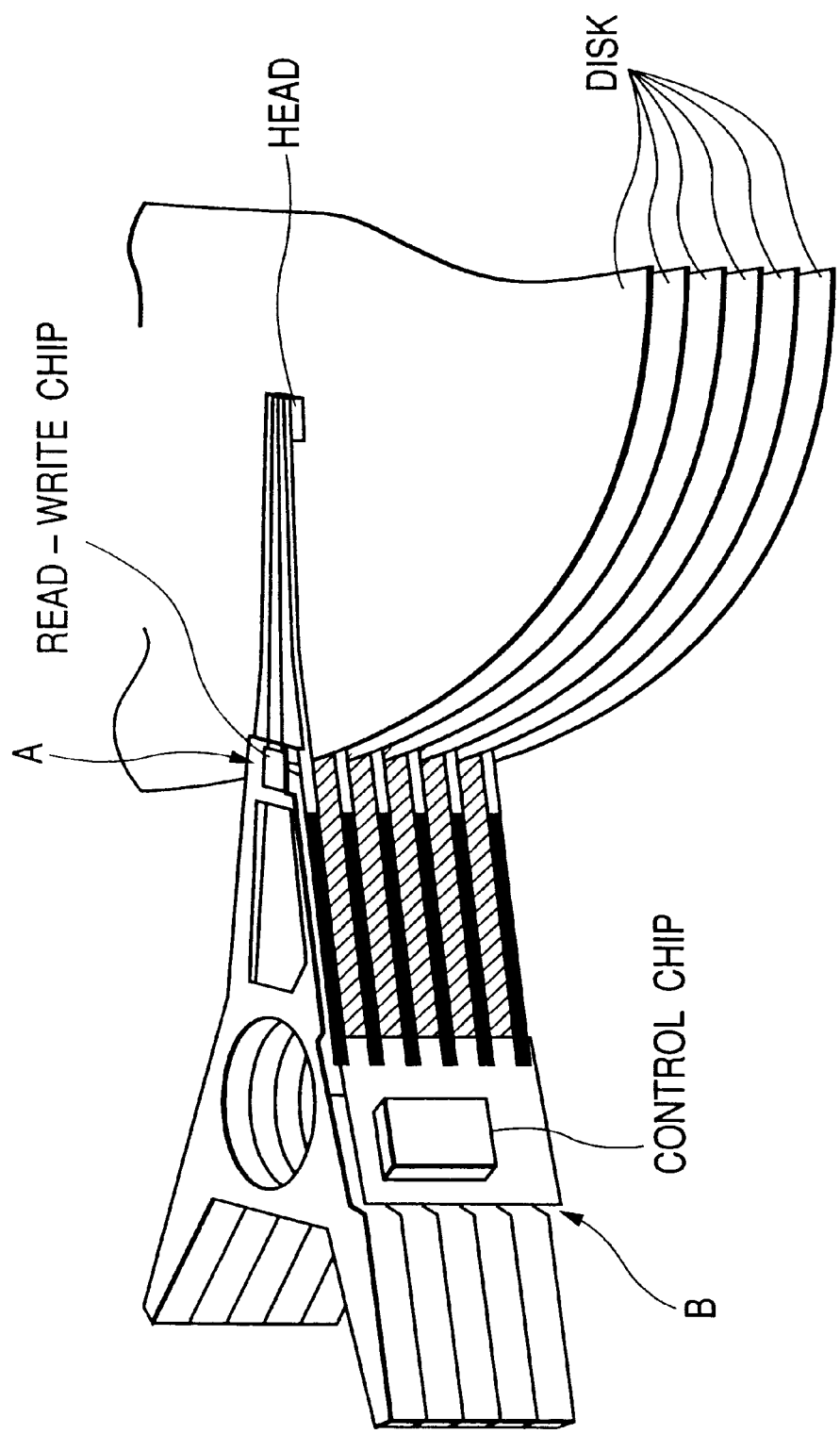

6,114,905

SIGNAL AMPLIFIER APPARATUS AND MAGNETIC DISK STORAGE APPARATUS USING THE SAME

BACKGROUND OF THE INVENTION

The present invention relates to a very-small-signal amplifier apparatus and a magnetic disk storage apparatus using the same. More specifically, the invention relates to a magnetic disk storage apparatus such as a hard disk drive and, particularly, to a technology that can be effectively utilized for amplifying very small signals by using a magnetoresistance effect element (MR) head as a read head and, particularly, to a technology that can be effectively utilized for amplifying very small signals by using a composite head including a magnetoresistance effect element as the read head and an inductive head as a write head.

A read amplifier for MR head constituted by CMOS (complementary MOS) has been disclosed in IEEE Journal of Solid State Circuits, Vol. 29, No. 12, December, 1994, pp. 1589–1595. According to the read amplifier disclosed in the above-mentioned literature, a bias current is supplied to an MR head through an amplifier MOSFET to generate take out a read current that varies depending upon a change in the magnetoresistance.

SUMMARY OF THE INVENTION

The above-mentioned read amplifier has an advantage that it can be operated on a single power source such as of 5 V (volt) while supplying a bias current to an MR head as described above to generate a read current that varies depending upon a change in the magnetoresistance thereof. When a read signal is obtained in the form of a current signal as described above, an inductance component of the wiring connecting the MR head to the read amplifier is contained in the current signal that is to be amplified. This results in involving a problem that the gain decreases at high frequencies. In a hard disk storage apparatus, there is a tendency to increase the recording density in order to increase the storage capacity. Accordingly, the frequency of the signal this is to be read spreads over a wide band up to high frequencies. Therefore, the above-mentioned current sensing system is no longer suited for increasing the density of recording.

As a sensing system adapted for increasing the storage density, there can be effectively employed a voltage sensing system which obtains a change in the magnetoresistance as a voltage signal. The MR head is operated in a state where an operation bias current is supplied, and a voltage signal obtained there is as small as, for example, about 20 mV inclusive of a DC component. Even though such a small voltage signal is supplied across the gate and the source of an amplifier MOSFET, the voltage across the gate and the source is not sufficient to operate the MOSFET and cannot be amplified. It can, therefore, be conceivable to use a level-shifting circuit such as a diode, and add a DC voltage produced by a level-shifting circuit to the above-mentioned voltage signal in order to apply it across the gate and the source of the amplifier MOSFET. In such a case, however, the circuit elements such as a diode for effecting the level-shifting operation and the resistive element themselves may be sources of noise. Such noise components mix into a small voltage signal generated depending upon a change in the magnetoresistance of the MR head, producing another problem in that a desired S/N ratio is not obtained.

In order to solve this problem it can be considered to employ two power-source circuits of positive polarity and negative polarity to use a negative voltage for the bias circuit on the source side of the amplifier MOSFET and to use a positive potential for the load circuit provided on the drain side. By using the two power sources of positive and negative polarities, a bias voltage is maintained that is necessary to operate the amplifier MOSFET and a voltage signal generated by the MR head is supplied as it is to the gate, thereby making it possible to ensure the above-mentioned S/N ratio. This, however, requires complex power-source circuits for generating a positive voltage and a negative voltage, making it difficult to decrease the size of the device and to lower the cost of production.

When a positive power source is used, a neutral point voltage can be applied to an end of the MR head, thereby generating a very small signal from the other end thereof, and ensuring a bias voltage necessary to operate the amplifier MOSFET. In general, however, the ground potential is applied to the magnetic disk in order to discharge static electricity that is generated due to air friction or the like when it rotates at a high speed. When the above-mentioned neutral point voltage is applied to the MR head, a discharge phenomenon may take place since the MR head and the magnetic disk are at different potentials. In order to prevent this discharge phenomenon between the MR head and the magnetic disk, it is generally considered convenient to apply the ground potential to an end of the MR head, thereby matching the potential of the magnetic disk that is at the ground potential of the circuit.

An object of the present invention is to provide a very-small-signal amplifier capable of amplifying very small signals of up to high frequencies with high sensitivity, while simplifying the circuit structure. Another object of the present invention is to provide a magnetic disk storage apparatus which realizes read operation over a wide band of up to high frequencies with high sensitivity, while simplifying the circuit. These and other objects as well as novel features of the present invention will be more apparent from the description in the specification and the accompanying drawings.

An outline of a representative aspect of the invention disclosed in this application will be briefly described. A modified differential circuit includes a first transistor of a first conductivity type and a second transistor of a second conductivity type each having a control terminal, a terminal of the input side and a terminal of the output side, wherein the terminals of the input side are connected in common, and a current is allowed to flow depending upon a voltage difference applied across the control terminals, and wherein a very small voltage signal generated by an input signal source means is applied to the control terminal of the first transistor, a bias voltage is applied to the control terminal of the second transistor, and an amplified signal corresponding to the very small voltage signal generated by the input signal source means is generated from the terminal on the output side of the second transistor.

Another representative aspect of the invention disclosed in this application will be briefly described below. A magnetic disk storage apparatus includes a disk-like magnetic storage medium to which a first potential for discharging static electricity that is generated due to rotational operation is applied, and a read head of a magnetoresistance effect element, to whose one end the first potential is applied and which outputs a read signal from the other end thereof, wherein use is made of a modified differential circuit including a first transistor of a first conductivity type and a second transistor of a second conductivity type each having a control terminal, a terminal of the input side and a terminal of the output side, the terminals of the input side being connected in common, and wherein a very small voltage signal generated by the read head is applied to the control terminal of the first transistor, a bias voltage is applied to the control terminal of the second transistor, and a signal amplified from the very small voltage signal generated by the read head is generated from the terminal of the output side of the second transistor.

BRIEF DESCRIPTION OF THE DRAWINGS

FIG. 20 is a diagram of essential portions, for schematically illustrating an example of the hard disk device according to the present invention;

PREFERRED EMBODIMENTS

Figure 1:
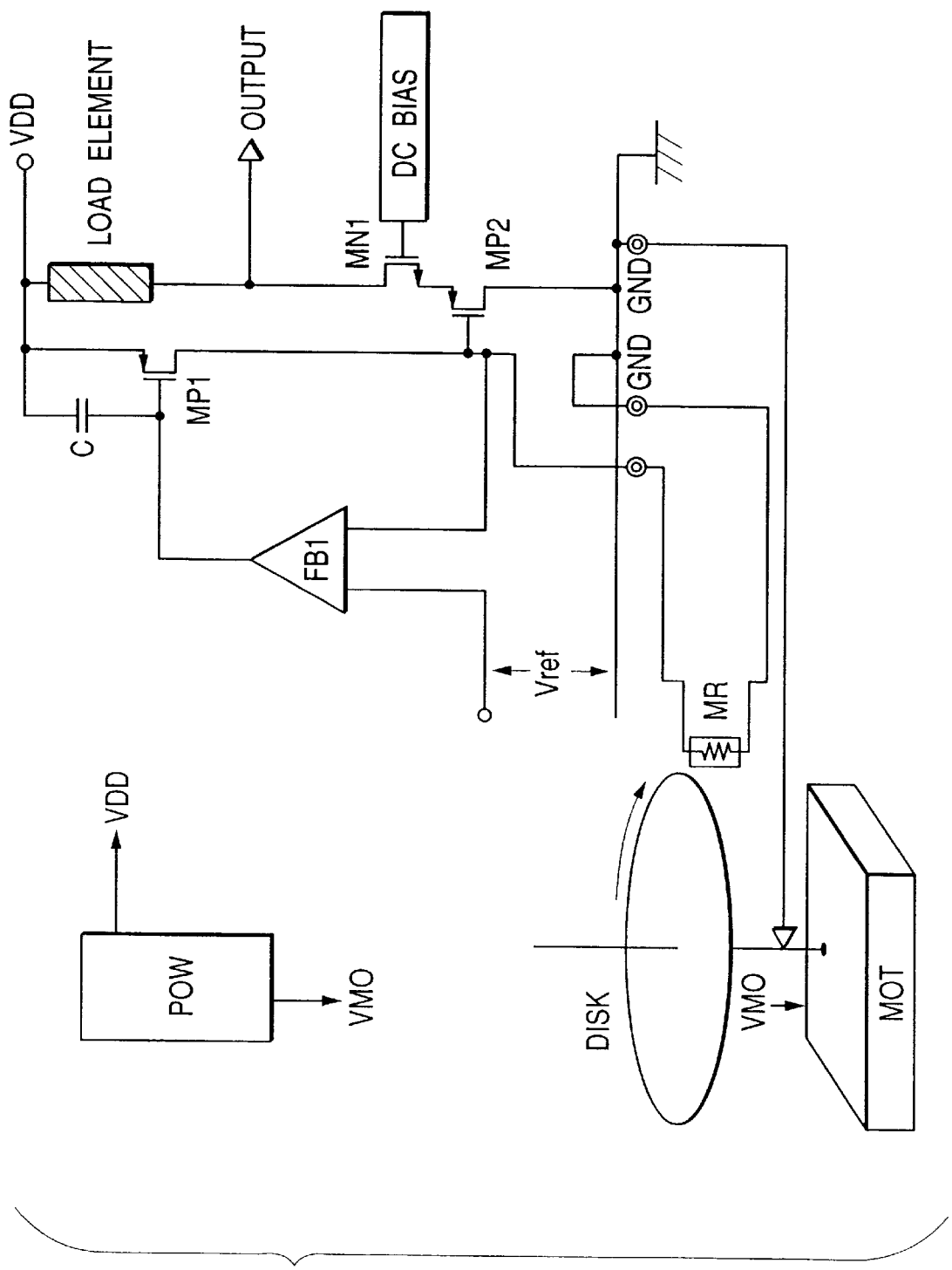
FIG. 1 is a diagram illustrating of essential portions of a read system in a magnetic disk storage apparatus of an embodiment according to the present invention.

FIG. 1 is a diagram illustrating the constitution of essential portions of a read system in the magnetic disk storage apparatus of an embodiment according to the present invention. A magnetic disk (hard disk) which is a magnetic storage medium is turned by a motor MOT which is a drive mechanism. The ground potential GND of the circuit is applied to the magnetic material on the surface of the magnetic disk through the rotary shaft of the motor MOT. The ground potential GND is applied in order to remove undesired electric charge that is generated due to air friction, or the like, resulting from high-speed rotation of the magnetic disk.

In the hard disk storage apparatus, for example, an aluminum substrate is used for the 3.5-inch system and a glass substrate is used for the 2.5-inch system. For example, an Ni-P plating film is formed on the surface of the substrate and a base film is formed thereon. A magnetic film is formed on the surface of the base film, and a protective film and a lubricating film are formed on the surface thereof. Thus, the recording surface is formed in a multilayer form. From the overall point of view for removing the electric charge generated by the air friction and the like, the surface is assumed to be electrically conductive, and the ground potential is applied to the rotary shaft so that the recording surface is provided with the ground potential.

In this embodiment, in order to prevent undesired discharge to the disk, the magnetoresistance effect element (hereinafter abbreviated as MR) head for reading is connected at its one end to the ground potential GND of the circuit so as to be at substantially the same potential. When the ground potential GND of the circuit is applied to an end of the MR head as described above, a voltage at the other end thereof produces only a very small voltage signal as described below. The MR head that has been known so far has a resistance of about 20 ohms, and a bias current of about 10 mA is allowed to flow therein. Therefore, the voltage that is generated is about 0.2 V at the greatest. A very small voltage is generated, as a signal component, depending upon a change in the resistance of the magnetoresistance effect element with the DC potential of about 0.2 V as the center.

This embodiment is of a voltage sensing system which obtains out voltage signals in order to read signals up to high frequencies to meet a high storage density of the magnetic disk. This is because, when a current sensing system is employed to take out current signals from the MR head depending upon a change in the magnetoresistance, a limitation is imposed on obtaining the high-frequency signals due to an inductance component of the wire connecting the MR head to the read pre-amplifier as described above.

In order to achieve the above-mentioned voltage sensing system for obtaining the voltage signals from the other end of the MR head corresponding to magnetic storage data in the magnetic disk as described above, use is made of the following second bias circuit. To the other end of the MR head is supplied a bias current through a P-channel MOSFET P1 to which, through the source thereof, a power-source voltage VDD (e.g., 3.3 V to 5 V) is supplied. The gate of the P-channel MOSFET P1 is supplied with the output signal of a feedback amplifier FB1 that receives a reference voltage Vref and with the voltage from the other end of the MR head.

A capacitor C is provided between the gate and the source of the MOSFET P1, and has a capacitance relatively large enough to by-pass the high-frequency signal components. Therefore, the other end of the MR head is supplied with a DC voltage bias corresponding to the reference voltage Vref through the feedback amplifier FB1, P-channel MOSFET P1 and capacitor C, making it possible to take out a very small AC signal corresponding to the magnetic storage data.

In this application, MOSFET means transistors including a metal/oxide film/semiconductor field-effect transistor and a metal/insulating film/semiconductor (MIS) FET. The gate electrode of the MOSFET contains not only a metal but also electrically conductive polycrystalline silicon.

In order to highly sensitively amplify the read signals over a wide band of up to high frequencies as described above, it is desirable that the read voltage signals of low voltage amplitudes are directly amplified. For this purpose, use is made of the following read amplifier as a very-small-signal amplifier circuit. The read amplifier constitutes the very-small-signal amplifier according to the present invention together with a very-small-signal source which includes the MR head.

A very small voltage signal generated from the other end of the MR head is supplied to the gate of a P-channel amplifier MOSFET MP2. The drain of the amplifier MOSFET MP2 is connected to the ground potential GND of the circuit. The source of the amplifier MOSFET MP2 is connected to the source of an N-channel amplifier MOSFET MN1 which is supplied with a DC bias voltage through the gate thereof.

The above-mentioned amplifier MOSFETs MP2 and MN1 are connected in a modified differential form or in a complementary differential form where the sources of the P-channel MOSFET and the N-channel MOSFET are connected in common and in series. The above-mentioned amplifier MOSFETs MP2 and MN1 are apparently different from a general differential form constituted by a pair of P-channel or N-channel MOSFETs. From such a viewpoint that the amplification operation is carried out based on the difference of gate voltage between the pair of MOSFETs, however, this is common to the above-mentioned general differential form. In this specification, therefore, such a connection form or an operation form is referred to as modified differential or complementary differential.

A load element is provided between the power supply voltage VDD and the drain of the N-channel amplifier MOSFET MN1. An output signal is produced from the drain of the amplifier MOSFET MN1. In the above-mentioned constitution, a read signal of a very small amplitude generated by the MR head is directly amplified by the P-channel MOSFETs MP2 and MN1 of the modified differential form, enabling the amplification operation with a good S/N ratio and a high sensitivity.

When a very-small-signal amplifier circuit inclusive of the read amplifier is operated on a single power supply in order to simplify the power supply device POW, the level of a voltage signal of a small amplitude can be shifted by using a diode and a resistor so as to supply the signal to the gate of the amplifier MOSFET such as an N-channel MOSFET or the like. When the level-shifting operation is effected, however, thermal noise generated by the diode or the resistor deteriorates the S/N ratio, making it no longer possible to execute the sensing operation with high sensitivity.

The power supply circuit POW generates the operating voltage VDD for the semiconductor integrated circuit device that includes the above-mentioned read amplifier and a post-amplifier and a write amplifier that will be described later, and further generates a drive voltage VMO for the motor MOT. Though there is no particular limitation, the operating voltages VDD and VMO may be the same such as about 5 V when the magnetic disk is of the 2.5-inch type. When the magnetic disk is of the 3.5-inch type, the motor drive voltage VMO is set to be high like 12 V.

The above-mentioned operating voltages VDD and VMO are positive voltages of the same polarity. For example, therefore, the operating voltage VMO is generated, then stepped down to 5 V to thereby generate the operating voltage VDD. This makes it possible to decrease the size and weight of the power supply device of the magnetic disk storage apparatus compared to the case where the two power supply voltages of positive polarity and of negative polarity are used in the read amplifier.

Figure 2:
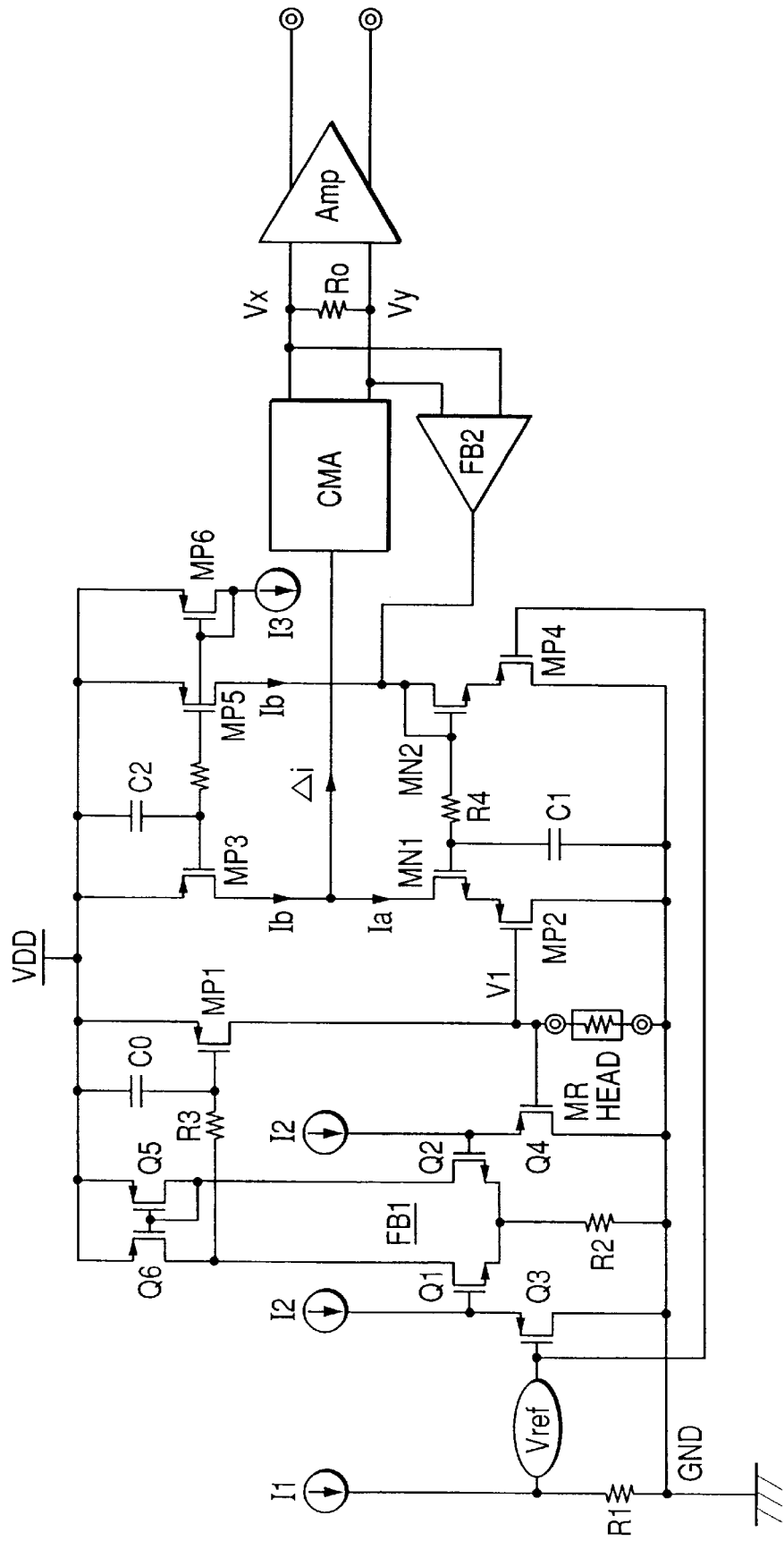
FIG. 2 is a circuit diagram illustrating an example of a read system circuit which corresponds to FIG. 1.

FIG. 2 is a circuit diagram illustrating an example of a read system circuit in the magnetic disk storage apparatus of the present invention. FIG. 2 shows a read amplifier, a first bias circuit for feeding a bias voltage to the read amplifier, a post-amplifier circuit for amplifying a read current amplified by the read amplifier, and a second bias circuit for feeding a bias voltage to the MR head.

A second bias circuit for feeding the bias voltage to the MR head is constituted by the following circuits. As described above, the source of the P-channel MOSFET MP1 that feeds the bias current to the MR head, is connected to a power supply line supplied with the power supply voltage VDD, and the above-mentioned capacitor C0 is connected between the gate and the source thereof. A constant current I1 produced by a constant-current circuit that is not shown is permitted to flow through the resistor R1, thereby to generate a reference voltage Vref corresponding to the bias voltage which is to be applied to the MR head.

The level of the reference voltage Vref is shifted by a source follower circuit constituted by a P-channel MOSFET Q3 and a constant-current source I2 provided at the source thereof, and is fed to the gate of an N-channel differential MOSFET Q1 which is one input constituting a feedback amplifier FB1. The level of a voltage V1 at the other end of the MR head of which the one end is at the ground potential GND, is shifted by a source follower circuit constituted by a similar P-channel MOSFET Q4 and a constant-current source I2 provided at the source thereof, and fed to the gate of an N-channel differential MOSFET Q2 which is the other input constituting the feedback amplifier FB1. A resistor R2 which serves as a constant-voltage source is provided between the ground potential GND of the circuit and the common sources of the differential MOSFETs Q1 and Q2.

Between the power supply VDD and the drains of the differential MOSFETs Q1, Q2, there are provided P-channel MOSFETs Q5 and Q6 which are in the form of a current mirror and are constituting an active load circuit. The drain output of the amplifier MOSFET Q1 is fed to the gate of the P-channel MOSFET MP1 that feeds the bias current to the MR head, through a resistor R3 which, together with the capacitor C0, constitutes a low-pass filter for by-passing high-frequency signal components. Therefore, the DC component of the voltage V1 at the other end of the MR head is controlled by the feedback amplifier FB1 so as to be equal to the reference voltage Vref. Accordingly, the MR head is biased with a constant voltage corresponding to the reference voltage Vref.

A very small voltage signal appearing at the other end of the MR head is amplified through the modified differential (complementary differential) MOSFETs MP2 and MN1 described above. The modified differential circuit executes the amplification operation by allowing a current that corresponds to the voltage applied across gates of the two amplifier MOSFETs MP2 and MN1 to flow. A constant-current load circuit that will be described below is provided as a load circuit for taking out a signal current Δi produced by the amplification. A constant current produced by a constant-current circuit that is not shown is permitted to flow through a P-channel MOSFET MP6 connected in the form of a diode, so that a bias current Ib flows through the modified differential MOSFETs MP2 and MN1 from the MOSFET MP6 and a P-channel MOSFET MP3 in the form of a current mirror.

The following first bias circuit is provided in order to apply a suitable bias voltage to the gate of the N-channel amplifier MOSFET MN1 irrespective of the threshold voltages of the modified differential MOSFETs MP2 and MN1, the change and variation in the operating current. The above-mentioned MOSFET MP6 is provided with a P-channel MOSFET MP5 in the form of a current mirror. The MOSFET MP5 produces a bias current Ib which is the same as that of the MOSFET MP3 and which flows through the MOSFET MN2 which is made to correspond to the amplifier MOSFET MN1 and has the same size. The gate and drain of the MOSFET MN2 are connected in common. To the source of the MOSFET MN2 is connected the source of a MOSFET MP4 which corresponds to the amplifier MOSFET MP2 and has the same gate length and the same gate width. The MOSFET MP4 is impressed with the ground potential of the circuit through the drain thereof and is impressed with the reference voltage Vref through the gate thereof.

Accordingly, the P-channel MOSFETs MP2 and MP4 are supplied with the same reference voltage Vref in a DC sense, and the bias current Ib produced depending upon the same constant current I3 flows into the drains of the paired N-channel MOSFETs MN1 and MN2. Therefore, a bias voltage is generated by the bias current Ib corresponding to the threshold voltage of the P-channel MOSFETs MP4 and MN2, and fed to the gate of the amplifier MOSFET MN1 through a resistor R4 which also serves as a DC feedback path.

When there is no signal or when viewed in a DC sense, the MOSFETs MP2, MN1 and MP3 constituting the amplifier circuit are substantially the same as the MOSFETs MP4, MN2 and MP5 constituting the second bias circuit. In other words, the MOSFETs MP4, MN2 and MP5 constituting the second bias circuit are constituted by copying the MOSFETs MP2, MN1 and MP3. When not considering variation in the threshold voltage of the pairs of MOSFETs such as MN1 and MN2, MP2 and MP4, and MP3 and MP5, therefore, the bias voltage Vl applied to the gates of the P-channel MOSFETs MP2 and MP4 is set to be equal to Vref, and a balance is maintained in a DC sense so that the current Ib flows through the N-channel MOSFETs MN1 and MN2 based on the same constant current I3.

Accordingly, the current Ib flowing through the MOSFET MP3 and the current Ia flowing through the MOSFET MN1 have a relationship Ib=Ia. A capacitor C2 provided between the gate and the source of the MOSFET MP3 and the capacitor C1 provided between the ground potential and the gate of the amplifier MOSFET MN1, cancel noise and AC signals inclusive of read signals in the above-mentioned feedback path, and the capacitor C1 maintains the voltage in order to adjust the offset in the above-mentioned first bias circuit.

In a state where a balance is set up in a DC sense, in the above-mentioned constitution, the drain current Ia of the amplifier MOSFET MN1 is equal to the drain current Ib from the P-channel MOSFET MP3 which is the load element, and the sense current Δi which is the difference between the currents Ib and Ia is zero.

When the resistance of the MR head changes due to magnetically recorded information stored in the magnetic disk, the voltage Vl changes by a very small amount correspondingly. For example, when the voltage V1 is raised by ΔV in an AC sense, a decreased voltage is applied between the gates of the modified differential MOSFETs MP2 and MN1, and the current Ia flowing through the amplifier MOSFETs MP2 and MN1 decreases by Δi correspondingly. On the other hand, the current Ib fed from the load element does not change, and an excess current Δi corresponding to the difference flows into a CMA (current mode amplifier) circuit that will be described below.

Conversely, when the voltage Vi decreases by ΔV in an AC sense, an increased voltage is applied between the gates of the modified differential MOSFETs MP2 and MN1, and the current Ia flowing through the amplifier MOSFETs MP2 and MN1 increases by Δi correspondingly. On the other hand, since the current Ib fed from the load element does not change, a shortage current Δi corresponding to the difference flows out from the CMA (current mode amplifier) circuit.

The CMA circuit, which will be concretely described later, is one which converts current signals of a single input mentioned above into differential or complementary current signals that change in opposite phase to each other, while amplifying the current. When such a CMA circuit is employed, a large gain can be obtained even on a low power supply voltage VDD to take out the amplified signals in the form of current signals. That is, when the amplified signal is taken out as a voltage signal, limitation is imposed on the dynamic range (signal amplitude) due to the power supply voltage VDD. However, such a limitation is not imposed when the current is amplified as described above. The thus amplified complementary differential currents flow through a resistor Ro and are converted into voltage signals Vx and Vy, which then outputted as read signals through the post-amplifier Amp.

Theoretically, no offset current is produced in a DC sense if the first bias circuit constituted by copying the amplifier circuit is used as described above, and the constant current I3 is correctly copied so that Ib=Ia as designed. Actually, however, it is considered that an offset current corresponding to the difference between the currents Ia and Ib flows even when there is no signal due to variation of the paired elements which are in a copied relationship as described above and formed in the semiconductor integrated circuit. The offset current is amplified by the CMA circuit and outputted as an offset voltage.

In this embodiment, a DC (direct current) feedback amplifier FB2 for compensating for the offset is provided so that the voltages Vx and Vy become zero in a DC sense. Upon receiving the voltages Vx and Vy, the DC feedback amplifier FB2 generates a corresponding current signal which is fed to the drain of the MOSFET MN2. Due to this current, the capacitor C1 is charged/discharged in a DC sense thereby to control the bias voltage of the MOSFET MN1, and to automatically compensate for the variation in the pair of elements, so that the above-mentioned relation Ib=Ia is established in a DC sense. The capacitor C1 is constituted so as to play the two roles, i.e., removing noise and cutting alternating current to accomplish the DC feedback.

The DC feedback amplifier FB2 so operates that the DC offset of the output of the CMA circuit becomes zero and, hence, exhibits an excellent effect that the offsets inclusive of that of the CMA circuit which uses the current mirror circuit as described below can be also adjusted.

Figure 3:
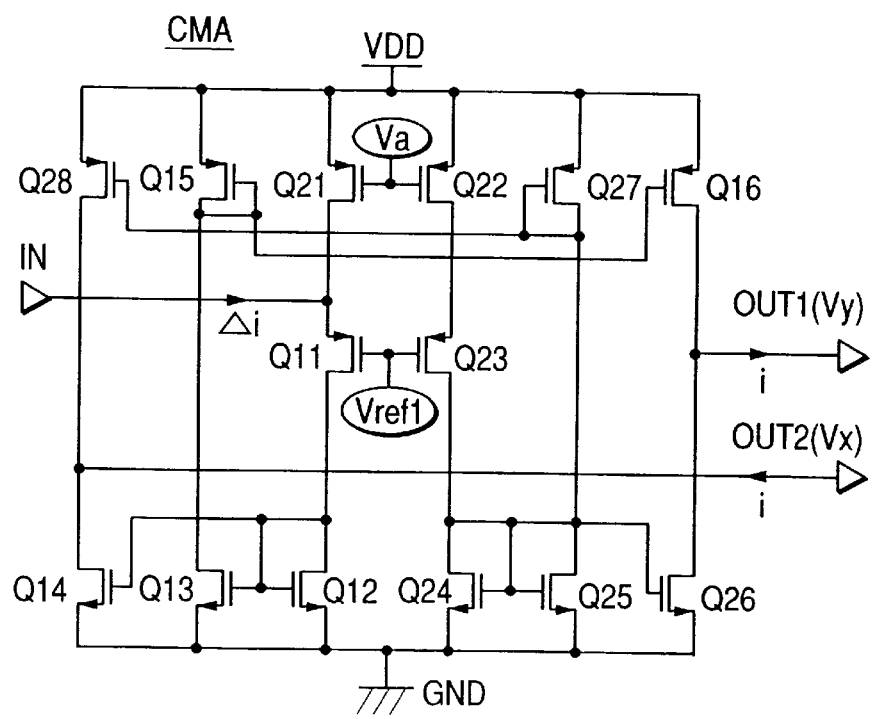
FIG. 3 is a circuit diagram illustrating an example of a CMA circuit used for the magnetic disk storage apparatus according to the present invention.

FIG. 3 is a circuit diagram illustrating an example of the CMA circuit. A reference voltage Vref1 is applied to the gates of P-channel MOSFETs Q11 and Q23. P-channel MOSFETs Q21 and Q22 to which a vias voltage Va is applied through the gates thereof are, respectively, connected in series between the power supply VDD and the sources of the MOSFETs Q11, Q23. N-channel MOSFETs Q12, Q24 connected in the form of diodes are, respectively, provided between the ground potential of the circuit and the drains of the MOSFETs Q11, Q23. A current signal $\Delta i$ generated by the read amplifier is fed to the source of the MOSFET Q11.

N-channel MOSFETs Q13 and Q14 connected in the form of a current mirror are provided to the one N-channel MOSFET Q12 which permits the flow of a current containing the current signal $\Delta i$. N-channel MOSFETs Q25 and Q26 connected in the form of a current mirror are provided to the other N-channel MOSFET Q24 which permits the flow of a bias constant current.

A P-channel MOSFET Q15 connected in the form of a diode is provided between the power supply VDD and the drain of the other MOSFET Q13 which permits the flow of a current containing the current signal $\Delta i$. The MOSFET Q15 is provided with a P-channel MOSFET Q16 connected in the form of a current mirror, and connected to the P-channel MOSFET Q16 which permits the flow of the bias constant current. Therefore, the commonly connected drains of the MOSFETs Q16 and Q26 are connected to an output terminal OUT1(Vy) to output a signal i in phase with the current signal $\Delta i$.

A P-channel MOSFET Q27 in the form of a diode is provided between the power supply VDD and the drain of the other MOSFET Q25 which permits the flow of the bias constant current. The MOSFET Q27 is provided with the P-channel MOSFET Q28 connected in the form of a current mirror, and connected to the one N-channel MOSFET Q14 which permits the flow of a current containing the current signal $\Delta i$. Therefore, the commonly connected drains of the MOSFETs Q28 and Q14 are connected to an output terminal OUT2(Vx) to output a signal i of opposite phase to the current signal $\Delta i$.

That is, the input signal $\Delta i$ is amplified in proportion to the ratio of current mirror sizes through the P-channel MOSFET Q11, N-channel MOSFETs Q12, Q13, Q14 and P-channel MOSFETs Q15, Q16. On the other hand, the above-mentioned bias constant current is amplified in proportion to the same ratio of current mirror sizes as the one mentioned above through the P-channel MOSFET Q23, N-channel MOSFETs Q24, Q25, Q26 and P-channel MOSFETS Q27, Q28.

A bias constant current increased in proportion to the current mirror ratio flows through the N-channel MOSFET Q26, and a current amplified in proportion to the current mirror ratio of the input signal $\Delta i$ flows through the P-channel MOSFET Q16, whereby the output terminal OUT1 produces an amplified current i in phase with the input signal $\Delta i$. Contrary to the above, a bias constant current increased in proportion to the current mirror ratio flows through the P-channel MOSFET Q28, and a current amplified in proportion to the current mirror ratio of the input signal $\Delta i$ flows through the N-channel MOSFET Q14, whereby the output terminal OUT2 produces an amplified current i of opposite phase to the input signal $\Delta i$. When the input signal $\Delta i$ is zero, the same bias constant current flows through the MOSFETs Q16, Q26 and Q28, Q14, and the output terminals OUT1 and OUT2 produce no current i.

Figure 4:
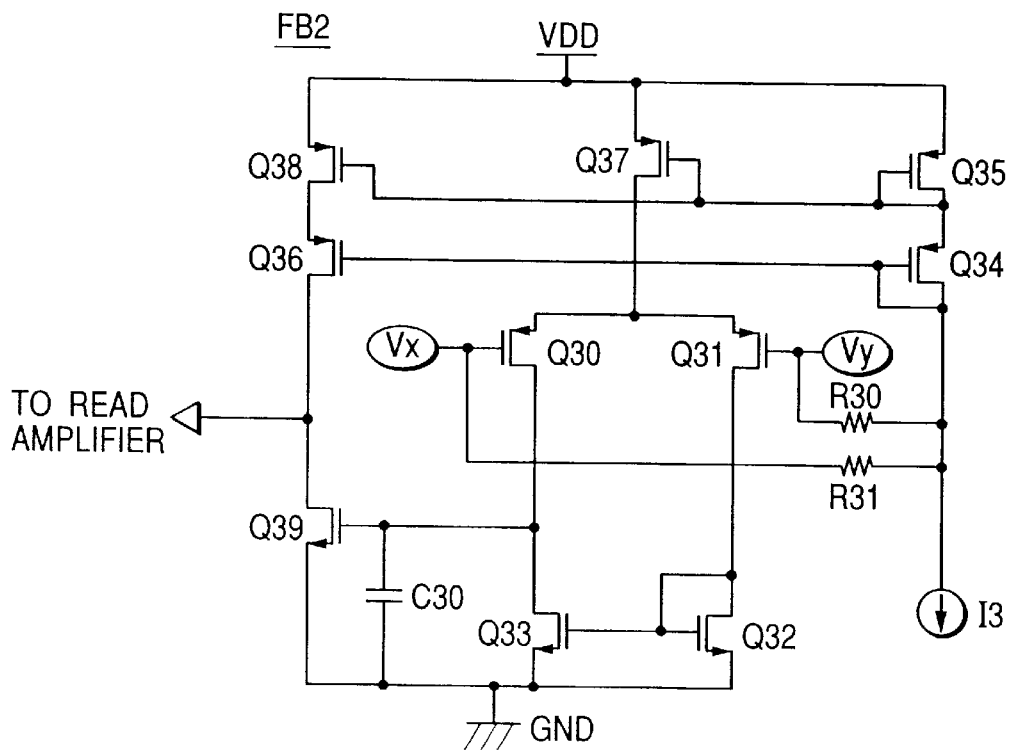
FIG. 4 is a circuit diagram illustrating an example of a feedback amplifier used in the magnetic disk storage apparatus according to the present invention.

FIG. 4 is a circuit diagram illustrating an example of the feedback amplifier. By causing the constant current I3 to flow through P-channel MOSFETs Q34 and Q35 connected in the form of diodes, a bias voltage corresponding to the threshold voltage of the MOSFETs Q34 and Q35 is generated at the commonly connected gate and drain of the MOSFET Q34. The bias voltage is supplied to the gates of P-channel MOSFETs Q31 and Q30 connected in a differential form through bias resistors R30 and R31. The above-mentioned output voltages Vx and vy are applied to the gates of these MOSFETs Q30 and Q31. The MOSFET Q35 and a P-channel MOSFET Q37 in the form of a current mirror are provided between the power supply VDD and the sources of the differential MOSFETs Q30 and Q31, to allow a bias current to flow through the differential MOSFETs Q30 and Q31.

N-channel MOSFETs Q32 and Q33 in the form of a current mirror and constituting an active load circuit are provided between the ground potential GND of the circuit and the drains of the differential MOSFETs Q31 and Q30. An output current is produced from the common drains of the MOSFETs Q30 and Q33, and supplied to a capacitor C30 which removes AC signal components. By using the DC component of the above differential circuit, the capacitor C30 effects charge/discharge to generate an operating voltage for an N-channel output MOSFET Q39. Between the drain of the MOSFET Q39 and the power supply VDD, there are provided the above-mentioned MOSFETs Q34, Q35 and the P-channel MOSFETs Q36, Q38 in the form of a current mirror, thereby to constitute a constant-current load.

The read amplifier is controlled through the feedback amplifier so that the output voltages Vx and Vy of the CMA circuit becomes equal to each other. In the feedback operation, the gate voltage of the MOSFET Q39 is controlled thereby to produce a control current for adjusting the bias current for the read amplifier. When the voltages Vx and Vy come into agreement with each other through the read amplifier and the CMA circuit, the charge/discharge of the capacitor C30 is halted, and the offset cancel is adjusted so as to maintain this state.

Figure 5:
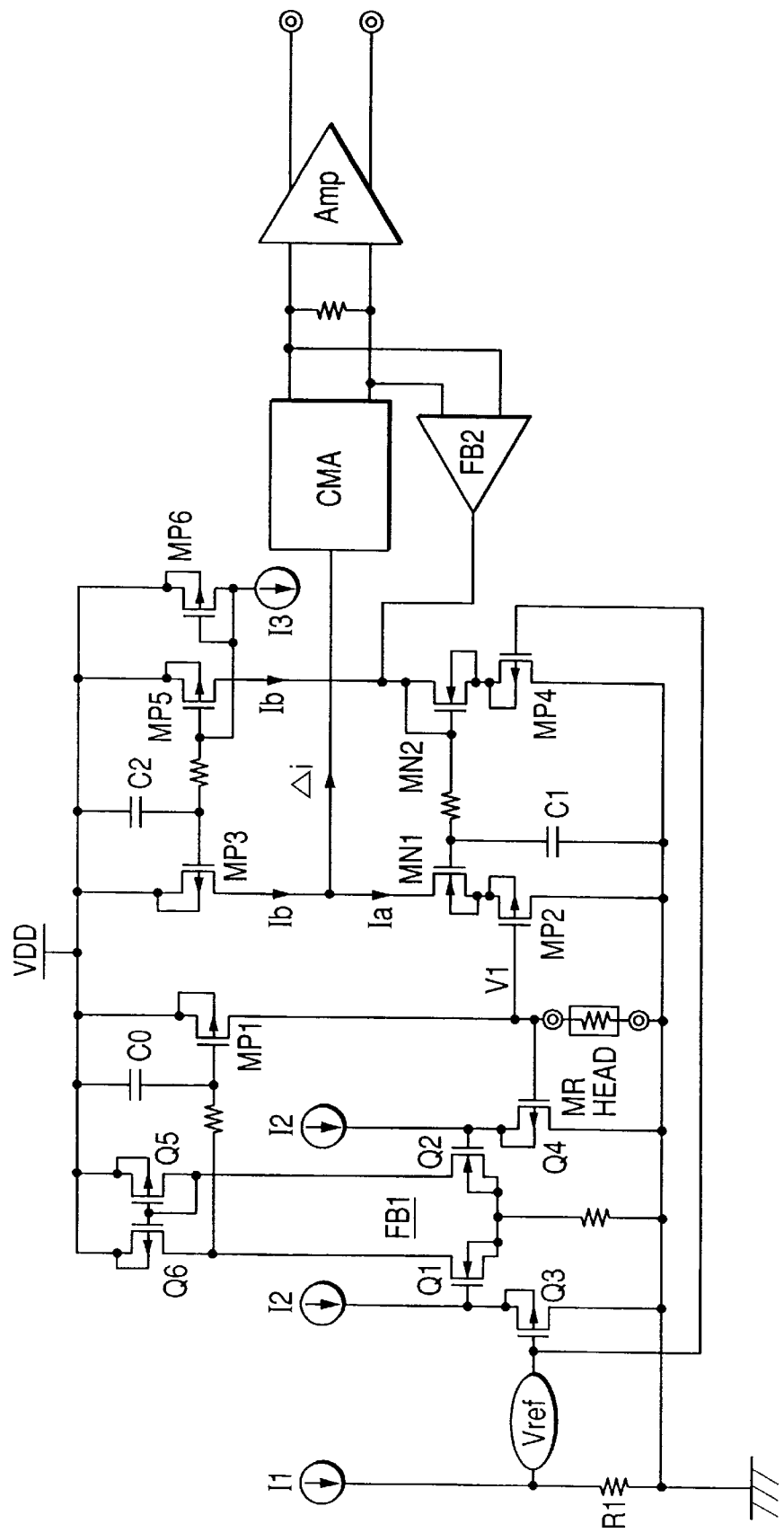
FIG. 5 is a circuit diagram illustrating another example of the read system circuit which corresponds to FIG. 1.

FIG. 5 is a circuit diagram illustrating another example of the read system circuit in the magnetic disk storage apparatus according to the present invention. Like FIG. 2, FIG. 5 shows a second bias circuit for feeding a bias voltage to the MR head, a read amplifier, a first bias circuit for feeding a bias voltage to the read amplifier, and a circuit block of a post-amplifier for amplifying the read current that has been amplified.

This embodiment is so devised that the power supply voltage VDD and the ground potential GND are little affected by noise. That is, when, for example, a P-type substrate is used for a CMOS integrated circuit, a P-channel MOSFET is formed in the N-type well region, the power supply voltage VDD is applied as a bias voltage to the N-type well region, an N-channel MOSFET is formed in the P-type substrate or in the P-type well region, and the ground potential of the circuit is applied as a bias voltage to the P-type substrate or to the P-type well region. Conversely, when an N-type substrate is used, the P-channel MOSFET is formed in the N-type substrate or in the N-type well region, the power supply voltage VDD is applied as a bias voltage to the N-type substrate or to the N-type well region, the N-channel MOSFET is formed in the P-type well region, and the ground potential of the circuit is applied as a bias voltage to the P-type well region.

Therefore, when the circuit elements shown in FIG. 2 are constituted into the above-mentioned device structure, the back bias voltage applied to the channel regions of the N-channel MOSFETs and the P-channel MOSFETs varies if noise is produced in the power supply voltage VDD or the ground potential of the circuit, and the currents flowing through the source and drain paths are affected by noise. If the noise is a problem, it is necessary to add means for stabilizing the power supply voltage VDD and ground potential of the circuit.

In this embodiment, the circuit constitution is the same as that of the embodiment of FIG. 2. In order not to be affected by noise even if noise enters the power supply voltage VDD or ground potential GND of the circuit, however, main MOSFETs constituting the amplifier circuit and the bias circuit are formed in electrically independent well regions which are commonly connected to the sources. However, the P-channel MOSFETs such as MOSFETs Q5, Q6, MP1, MP3, MP5 and MP6 are supplied with the power supply voltage VDD through the sources thereof, and does not need to be formed in the electrically independent well regions. By using the circuit elements thus constituted, the amplification can be stably carried out without any particular countermeasure against noise in the power supply voltage or ground potential.

Figure 6:
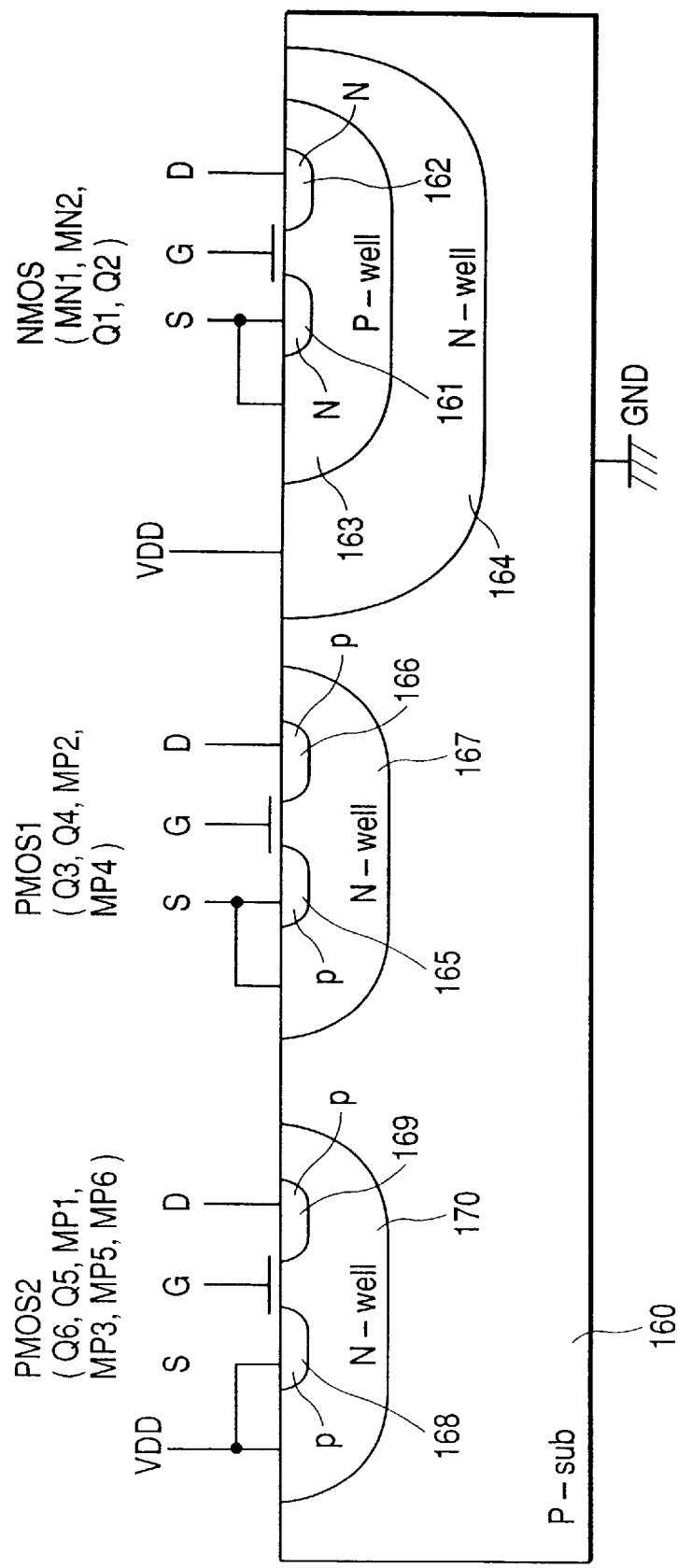
FIG. 6 is a sectional view of a device structure of an example of a CMOS integrated circuit used for the read system circuit in the magnetic disk storage apparatus according to the present invention.

FIG. 6 is a schematical sectional view of a device, for illustrating a CMOS integrated circuit according to the present invention. FIG. 6 illustrates, in cross section, the structure of a CMOS device having a semiconductor substrate (P-sub) 160 of the P-type conductivity. An N-type source region (S) 161 and an N-type drain region (D) 162 of an N-channel MOSFET (NM1, MN2, Q1, Q2) denoted by NMOS are formed in a P-type well 163.

The P-type well 163 is coupled to the source electrode S of the NMOS, and the potential of the P-type well 163 is equal to the potential at the source of the NMOS. The P-type well 163 is formed in an N-type well 164 in a P-type semiconductor substrate 160 whose potential is the ground potential GND. Symbol G denotes a gate electrode.

On the other hand, a P-type source region (S) 165 and a P-type drain region (D) 166 of a P-channel MOSFET (MP2, MP4, Q3, Q4) denoted by PMOS1 are formed in an N-type well 167. The N-type well 167 is coupled to the source electrode S of the PMOS1, and the potential of the N-type well 167 is equal to the potential at the source of the NMOS.

A P-type source region (S) 168 and a P-type drain region (D) 169 of a P-channel MOSFET (Q5, Q6, MP1, MP3, MP5, MP6) denoted by PMOS2 are formed in an N-type well 170. The N-type well potential 170 is coupled to the source potential S of the PMOS1 and is set to be equal to the power supply voltage VDD. As described above, the CMOS integrated circuit constituting the read amplifier according to the present invention is constituted by three kinds of structure as shown in FIG. 6, whereby even when undesired noise is generated in the power supply voltage VDD or ground potential GND, the effect of noise can be weakened.

In this constitution, the amplifier MOSFETs MP2 and MN1 constituting the read amplifier, MOSFETs MP4 and MN2 constituting a mirror circuit together therewith to produce a bias voltage, N-channel differential MOSFETs Q1 and Q2 constituting the feedback amplifier FBI for generating a bias voltage that is applied to the MR head, and source follower MOSFETs Q3 and Q4 all operate stably without being affected by noise that is superposed on the power-source voltage VDD or ground potential GND of the circuit. It is therefore possible to constitute a highly sensitive read amplifier having an improved S/N ratio without adding any special noise-reducing circuit for the power supply voltage VDD or ground potential of the circuit.

In the circuits shown in FIGS. 3 and 4 constituting the CMA circuit and the DC feedback amplifier FB2 of FIG. 6, too, the MOSFETs supplied with neither the power supply voltage VDD nor ground potential of the circuit through the sources thereof, as represented by MOSFETs Q11, Q23, Q30 and Q31, are formed in the independent well regions as described above. The individual well regions are connected to the sources of the corresponding MOSFETS.

It is desirable that the above-mentioned self-bias is applied to all MOSFETs as described above. In this case, however, the well regions must be double well regions or triple well regions, leading to a complex manufacturing process. Therefore, the self-bias may be suitably and selectively applied to the MOSFETs to achieve the required performance.

Figure 7:
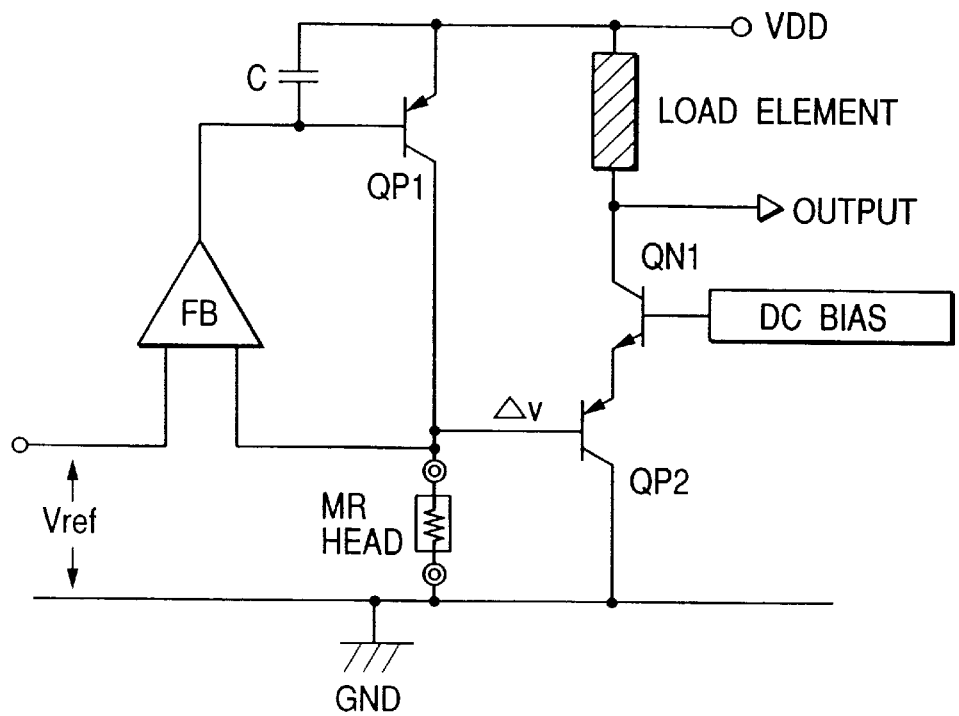
FIG. 7 is a diagram of the constitution of essential portions of the read system, for illustrating another embodiment of the magnetic disk storage apparatus according to the present invention.

FIG. 7 is a circuit diagram illustrating another example of the read amplifier according to the present invention. In this embodiment, the elements are constituted of bipolar transistors instead of the above-mentioned MOSFETs. That is, the N-channel MOSFET MN1 in the embodiment of FIG. 1 is replaced by an NPN-type transistor QN1, and the P-channel MOSFETs MP1 and MP2 are replaced by PNP-type transistors QP1 and QP2. Elements constituting other circuits inclusive of the feedback amplifier FB for generating a bias voltage that is applied to the MR head, are replaced by bipolar transistors, too. That is, the read/write semiconductor integrated circuit device in the magnetic disk storage apparatus of this embodiment is constituted by a bipolar integrated circuit.

Figure 8:
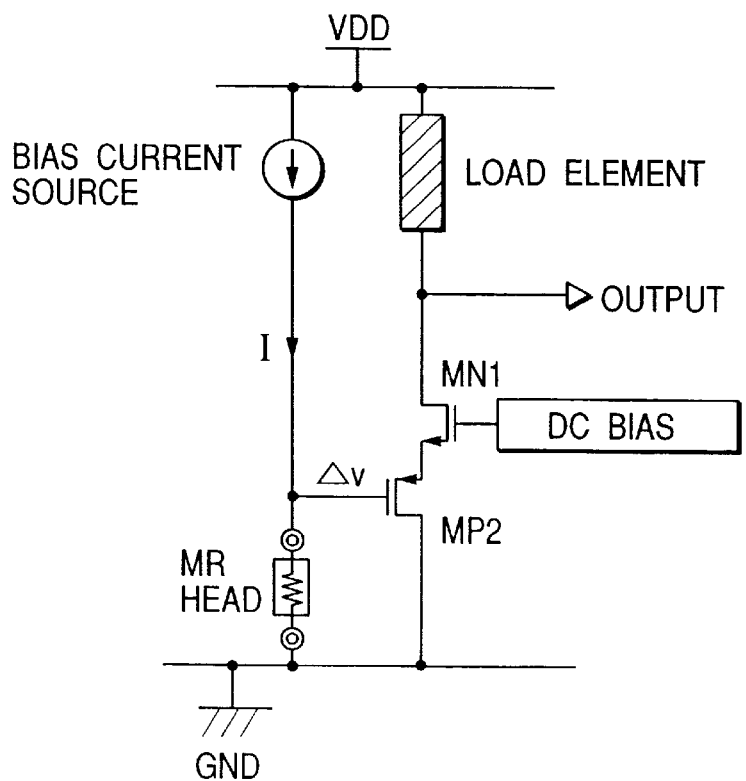
FIG. 8 is a diagram of the constitution of essential portions of the read system, for illustrating a further embodiment of the magnetic disk storage apparatus according to the present invention.

FIG. 8 is a circuit diagram illustrating a further example of the read amplifier according to the present invention. A constant current I may be supplied from the source of bias current instead of supplying the above-mentioned bias voltage to the MR head from a standpoint of realizing the operation with a high sensitivity at up to high frequencies while achieving simplification of the circuit, which is the object of the present invention, concretely, from the standpoint of setting the potential of the magnetic disk to the ground potential, and setting the potential at an end of the MR head to the ground potential correspondingly thereto, thereby to constitute the read amplifier by using a single power source.

In this case, too, a voltage signal ΔV over a wide band is generated from the other end of the MR head depending on a change in the magnetoresistance without being affected by the inductance component in the lead wire for connection to the MR head. In order to amplify a very small voltage ΔV close to the ground potential, use is made of the P-channel MOSFET MP2 and the N-channel MOSFET MN1 connected in the above-mentioned modified differential form.

Figure 9:
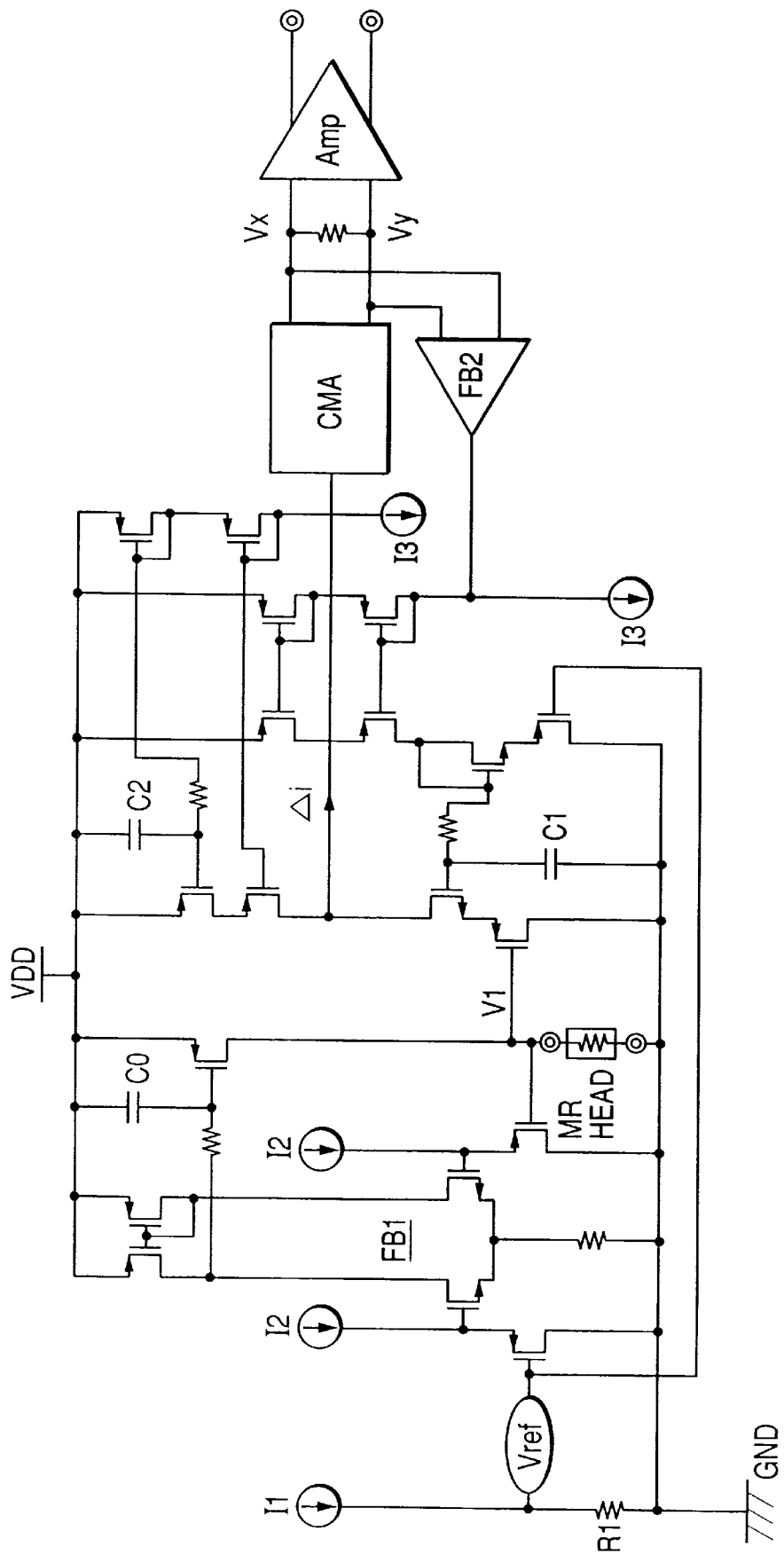
FIG. 9 is a circuit diagram illustrating a still further embodiment of the read system circuit which corresponds to FIG. 1.

FIG. 9 is a circuit diagram illustrating a further example of the read system circuit in the magnetic disk storage apparatus according to the present invention. Like FIG. 2, FIG. 9 shows a second bias circuit for feeding a bias voltage to the MR head, a read amplifier, a first bias circuit for feeding a bias voltage to the read amplifier, and a circuit block of a post-amplifier for amplifying a read current that has been amplified. The circuit of FIG. 9 is basically the same as that of the embodiment of FIG. 2 and, hence, no symbol is attached to the MOSFETs.

In this example, the first bias circuit provided in the read amplifier is different from that of the example of FIG. 2. Except for the first bias circuit, however, the constitution is the same as that of the example of FIG. 2. In this example, current mirror circuits are independently constituted by separately formed constant-current sources I3 in order to independently generate bias currents Ib that are supplied to the MOSFETs for effecting amplification and to the MOSFETs connected in the form of a mirror circuit that forms a bias voltage to be applied thereto. The output current of the feedback amplifier FB2 is added to the constant-current source I3 corresponding to the mirror circuit that generates the bias voltage. In this embodiment, the bias circuit and the way of applying a feedback for compensating the offset corresponding thereto are different. The basic circuit operation, however, is the same as that of the embodiment of FIG. 2.

Figure 10:
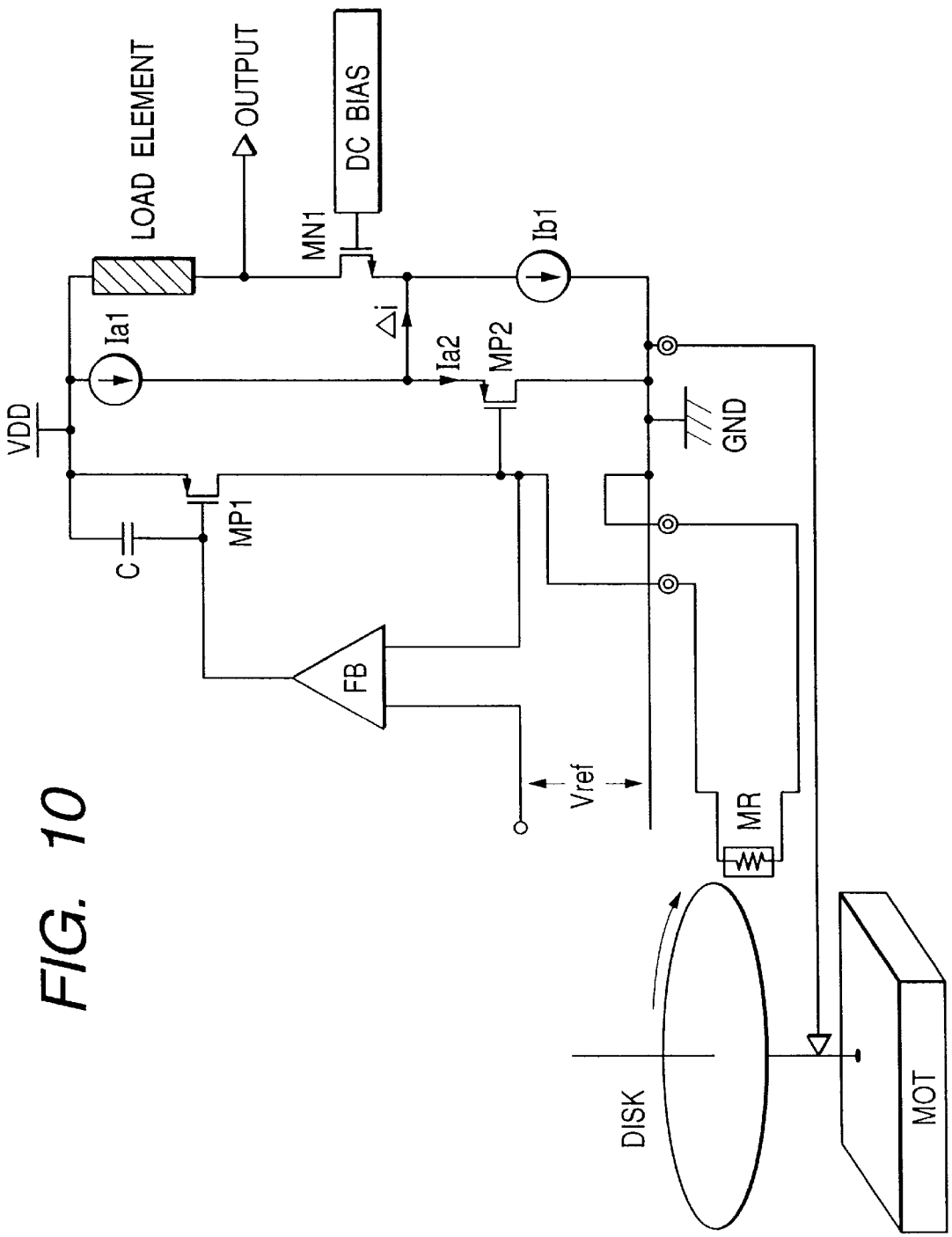
FIG. 10 is a diagram of the constitution of essential portions of the read system, for illustrating a further embodiment of the magnetic disk storage apparatus according to the present invention.

FIG. 10 is a diagram of the constitution of essential portions of the read system in the magnetic disk storage apparatus of a further embodiment according to the present invention. Like in the embodiment of FIG. 1, the disk which is a magnetic storage medium is turned by a motor MOT which is a drive mechanism. The ground potential GND of the circuit is applied to the surface of the disk through a rotary shaft of the motor MOT. In order to prevent undesired discharge relative to the disk, the MR head for reading is connected at its one end to the ground potential GND of the circuit and substantially assumes the ground potential.

This embodiment employs a voltage sensing system for taking out voltage signals in order to read signals of up to high frequencies correspondingly to a high storage density of the magnetic disk. To accomplish a voltage sensing system that takes out voltage signals corresponding to magnetically recorded information stored on the magnetic disk from the other end of the MR head as described above, a bias current is supplied to the other end of the MR head through the P-channel MOSFET MP1 that is supplied with the power supply voltage VDD through the source thereof. The P-channel MOSFET MP1 is supplied, through the gate thereof, with the output signal of the feedback amplifier FB1 that receives the reference voltage Vref and the voltage VI from the other end of the MR head.

Between the gate and the source of the MOSFET MP1 is provided a capacitor C having a capacitance which is relatively large enough to by-pass high-frequency signal components. Accordingly, a DC voltage bias V1 corresponding to the reference voltage Vref is applied to the other end of the MR head through the feedback amplifier FB1, P-channel MOSFET MP1 and capacitor C, thereby to take out a very small AC signal corresponding to the magnetically recorded information that is stored.

In order to highly sensitively amplify the read signals over a wide band of up to high frequencies as described above, the read voltage signal V1 of a low voltage is directly amplified. The very small voltage signal V1 generated from the other end of the MR head is supplied to the gate of the P-channel amplifier MOSFET MP2. The drain of the amplifier MOSFET MP2 is connected to the ground potential GND of the circuit. The source of the amplifier MOSFET MP2 is connected to the source of the N-channel amplifier MOSFET MN1 which is supplied with the DC bias voltage through the gate thereof, thereby to be in a modified differential form in the same manner as described above.

In this embodiment, a constant-current source for producing a bias current Ia1 is provided between the source of the amplifier MOSFET MP2 and the power supply VDD and, similarly, a constant-current source for producing a bias current Ib1 is provided between the source of the amplifier MOSFET MN1 and the ground potential GND of the circuit. A load element is provided between the drain of the N-channel amplifier MOSFET MN1 and the power supply voltage VDD. An output signal is generated from the drain of the amplifier MOSFET MN1. In the above-mentioned constitution, the read signal V1 of a very small amplitude generated by the MR head is directly amplified through the P-channel MOSFETs MP2 and MN1 in the modified differential form, making it possible to carry out the amplification at a good S/N ratio with a high sensitivity.

A DC bias voltage applied to the gate of the amplifier MOSFET MN1 is set to a value that is obtained by applying, to the bias voltage Vref applied to the MR head, a voltage (threshold voltage) that is generated across the gate and the source of the MOSFET MP2 when the bias current Ia1 flows through the amplifier MOSFET MP2 and a voltage (threshold voltage) that is generated across the gate and the source of the MOSFET MN1 when the bias current Ib1 flows through the amplifier MOSFET MN1. In a state where a balance is set up in a DC sense, the drain current Ia2 of the amplifier MOSFET MN1 is equal to the bias current from the constant-current source Ia1, and the sense current Δi which is a difference between the currents Ia1 and Ia2 becomes zero.

When the resistance of the MR head changes due to magnetically recorded information stored in the disk, the voltage V1 varies by only a very small amount corresponding thereto. For example, when the voltage V1 is raised by ΔV in an AC sense, the voltage applied across the gates of the MOSFETs MP2 and MN1 in the modified differential form decreases, and the current flowing through the amplifier MOSFETs MP2 and MN1 decreases correspondingly. That is, the current Ia2 flowing through the amplifier MOSFET MP2 decreases by Δi. On the other hand, the bias current Ia1 supplied from the constant-current source does not change and, hence, an excess current Δi corresponding to the difference is generated. At this moment, the bias current Ib1 on the source side remains constant on the amplifier MOSFET MN1 side, too. Therefore, the current Δi is outputted through the amplifier MOSFET MN1.

Conversely, when the voltage V1 is decreased by ΔV in an AC sense, the voltage applied across the gates of the MOSFETs MP2 and MN1 of the modified differential form increases, and the current that flows through the amplifier MOSFETs MP2 and MN1 increases by Δi. That is, the current Ia2 flowing through the amplifier MOSFET MP2 increases by Δi. On the other hand, the bias current Ia1 supplied from the constant-current source does not change and, hence, a shortage current Δi corresponding to the difference is produced. At this moment, the bias current Ib1 on the source side remains constant on the amplifier MOSFET MN1 side, too. Therefore, the shortage current Δi is outputted through the amplifier MOSFET MN1.

Figure 11:
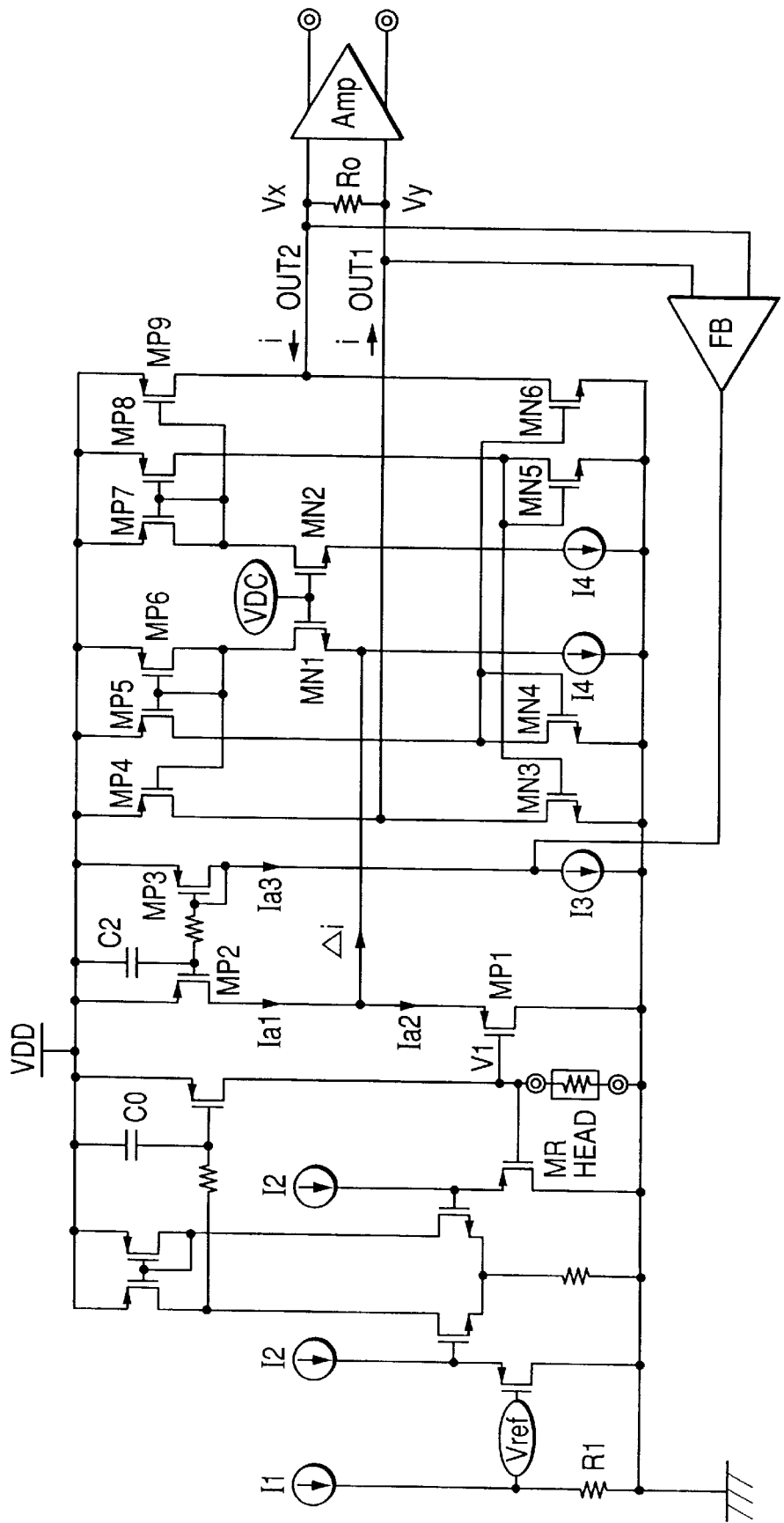
FIG. 11 is a circuit diagram illustrating an example of the read system circuit which corresponds to FIG. 10.

FIG. 11 is a circuit diagram illustrating an example of the read system circuit which corresponds to FIG. 10. FIG. 11 shows a read amplifier, a first bias circuit for feeding a bias voltage to the read amplifier, a post-amplifier for amplifying the read current that has been amplified by the read amplifier, and a second bias circuit for feeding a bias current to the MR head. Like the circuit in the embodiment shown in FIG. 2, the second bias circuit for feeding the bias voltage V1 to the MR head produces a constant current I1 correspondingly to the reference voltage Vref generated by allowing a constant current I1 to flow through the resistor R1. In FIG. 11, symbols are attached to only those elements that are necessary to describe the feature of the embodiment. It should be noted that the symbols are different from those attached to the preceding circuit diagrams for the purpose of easy comprehension.

A very small voltage signal appearing at the other end of the MR head is amplified through the modified differential (complementary differential) MOSFETs MP1 and MN1 that have been described above. The constant-current source for producing the bias current Ia1 fed to the amplifier MOSFET MP1 is constituted by a current mirror circuit of P-channel MOSFETs MP3 and MP2 that are fed with a constant current Ia3 produced by the constant-current circuit I3. For the amplifier MOSFET MN1, a constant-current circuit I4 serves as a constant-current source for producing a bias current.

In this embodiment, the following circuit is provided as a first bias circuit so that a bias voltage VDC applied to the gate of the N-channel amplifier MOSFET MN1 is automatically controlled to assume an optimum value irrespective of the change and variation of the threshold voltage and the operating current of the MOSFETs MP2 and MN1 in the modified differential form. The first bias circuit also serves as an amplifier circuit for amplifying a current signal generated by the above modified differential circuit.

The bias voltage VDC is applied to the gate of the amplifier MOSFET MN1 and to the gate of the MOSFET MN2 which is a copy circuit provided correspondingly to the amplifier MOSFET MN1. The constant-current circuits I4 are, respectively, provided between the ground potential of the circuit and sources of the MOSFETs MN1, MN2. P-channel MOSFETs MP6 and MP7 connected in the form of diodes are, respectively, provided between the power supply VDD and drains of the MOSFETs MN1 and MN2.

P-channel MOSFETs MP4 and MP5 connected in the form of a current mirror are provided for the diode-connected P-channel MOSFET MP6 that is provided to the drain of the amplifier MOSFET MN1 which permits the flow of a current containing the current signal Δi. The MOSFET MN2 is provided by copying the amplifier MOSFET MN1, and permits the flow of a bias current only that is produced by the constant-current circuit 14. P-channel MOSFETs MP8 and MP9 in the form of a current mirror are also provided to a diode-connected P-channel MOSFET MP7 that is provided to the drain of the MOSFET MN2.

An N-channel MOSFET MN4 connected in the form of a diode is provided between the ground potential of the circuit and the drain of the P-channel MOSFET MP5 which permits the flow of a current containing the current signal Δi. The MOSFET MN4 is provided with an N-channel MOSFET MN6 connected in the form of a current mirror. The drain of the MOSFET MN6 is connected to the drain of a P-channel MOSFET MP9 which corresponds to the N-channel MOSFET MN2 that is a copied circuit and permits the flow of the bias constant current. Therefore, the commonly connected drains of the MOSFETs MN6 and MP9 serve as an output terminal OUT1 to produce an output current −i in opposite phase to that of the current signal Δi.

An N-channel MOSFET MN5 connected in the form of a diode is provided between the ground potential of the circuit and the drain of the P-channel MOSFET MP8 which permits the flow of the bias constant current. The MOSFET MN5 is provided with a P-channel MOSFET MN3 connected in the form of a current mirror. The drain of the P-channel MOSFET MN3 is connected to the drain of the N-channel MOSFET MP4 which permits the flow of a current containing the current signal Δi. Therefore, the commonly connected drains of the MOSFETs MN3 and MP4 serve as an output terminal OUTI to generate an output signal +i in phase with the current signal Δi.

That is, the current signal Δi is amplified in proportion to the ratio of current mirror sizes through the N-channel amplifier MOSFET MN1, P-channel MOSFETs MP6, MN4, MN5 and N-channel MOSFETs MN4, MN6. Meanwhile, the bias constant current is amplified in proportion to the same ratio of current mirror sizes through the N-channel MOSFET MN2 which is a copied circuit, P-channel MOSFETs MP7, MP8, MP9 and N-channel MOSFETs MN5, MN3.

Therefore a bias constant current increased in proportion to the current mirror ratio flows through the N-channel MOSFET MN3 and a current i amplified in proportion to the current mirror ratio of the input signal Δi flows through the P-channel MOSFET MP4, whereby the output terminal OUT1 produces a current −i in phase with the input signal Δi. Contrary to the above, a bias constant current increased in proportion to the current mirror ratio flows through the P-channel MOSFET MP9 and a current i amplified in proportion to the current mirror ratio of the input signal Δi flows through the N-channel MOSFET MN6, whereby the output terminal OUT2 produces a current −i with opposite phase to that of the input signal Δi. When the input signal Δi is zero, the same bias constant current flows through the MOSFETs MN3, MP4, MN6 and MP9 and, hence, no output current flows through the output terminals OUT1 and OUT2.

Thus, the CMA circuit shown in FIG. 3 inclusive of the amplifier MOSFET MN1 is constituted, and the current of the input signal Δi is amplified. That is, the current signals Δi corresponding to the voltage signal generated by the MR head are converted into differential or complementary current signals which have opposite phases to each other, while being amplified. When the amplifier MOSFET MN1 is incorporated in the above CMA circuit, the amplified signals are taken out in the form of current signals making it possible to achieve a large gain even on a low power supply voltage VDD. The thus amplified complementary or differential currents are caused to flow through the resistor Ro so as to be converted into voltage signals Vx and Vy, which are then passed through a post-amplifier Amp and outputted as read signals.

As described above, the CMA circuit is constituted by the amplifier MOSFETs and MOSFETS copied therefrom, and is used for constituting a DC (direct current) feedback amplifier FB for compensating the offset so that the voltages Vx and Vy are zero in a DC sense as described above. Upon receiving the voltages Vx and Vy, though there is no particular limitation, the DC feedback amplifier FB generates a current signal corresponding thereto and feeds it back to the constant-current circuit I3 that produces a bias current Ia1 fed to the amplifier MOSFET MP1. Due to this current, the feedback is effected and an automatic adjustment is accomplished so that the bias voltage VDC comes into agreement with a voltage generated by adding threshold voltages of the MOSFETs MP1 and MN1 to the bias voltage V1 of the MR head.

When a bias voltage applied across the gates of the amplifier MOSFETs MP1 and MN1 is large relative to the current balance due to variation in the elements or variation in the bias voltage VDC, the DC feedback amplifier FB produces a sink current to increase the bias current Ia1 that flows through the amplifier MOSFET MP1. Accordingly, the threshold voltage of the MOSFET MP1 increases to keep the balance to match with the bias voltage VDC in a DC sense. Contrary to the above, when the bias voltage VDC is small relative to the current balance, the DC feedback amplifier FB produces a push current for the compensation to decrease the bias current Ia1 that flows through the amplifier MOSFET MP1. Accordingly, the threshold voltage of the MOSFET MP1 decreases to keep the balance in a DC sense in a manner as described above.

In this example, the above-mentioned substantial bias circuit also serves to amplify the current. Therefore, the number of the circuit elements can be decreased compared with the one provided with the CMA circuit of the embodiment of FIG. 2. Besides, the DC offset of the output of the CMA circuit for amplifying the current and further adjusting the bias can be brought to zero. Like the embodiment of FIG. 2, therefore, an excellent effect is exhibited making it further possible to adjust the offset inclusive of that of the CMA circuit which uses the current mirror circuit.

Figure 12:
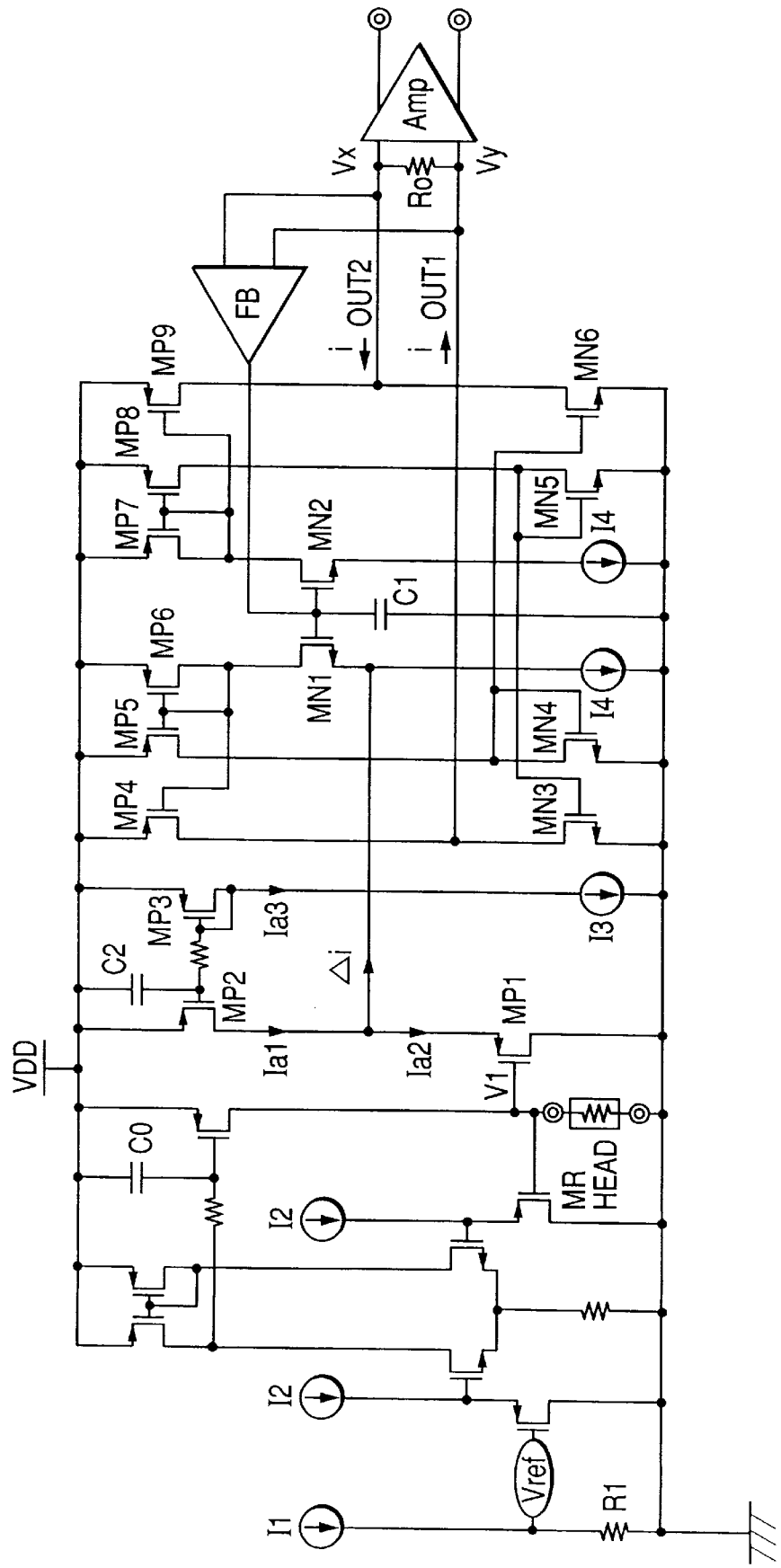
FIG. 12 is a circuit diagram illustrating another example of the read system circuit which corresponds to FIG. 10.

FIG. 12 is a circuit diagram illustrating another example of the read system circuit which corresponds to FIG. 10. FIG. 12 shows a read amplifier, a first bias circuit for feeding a bias voltage to the read amplifier, a post-amplifier for amplifying a read current amplified by the read amplifier, and a second bias circuit for feeding a bias voltage to the MR head.

This example is basically the same as the example of FIG. 11, and generates a bias voltage VDC that is supplied to the gate of the amplifier MOSFET MN1, using the output current of the DC feedback amplifier FB. That is, a capacitor C1 is connected to the gates of the MOSFETs MN1 and MN2, and is charged/discharged by the output current of the DC feedback amplifier FB to hold the bias voltage VDC.

In this constitution, the constant-voltage circuit for generating the bias voltage VDC is omitted as described above and the capacitor C1 is simply used instead, enabling the circuit to be simplified. In this constitution, too, the DC feedback amplifier FB generates the bias voltage VDC so that the bias voltage applied across the gates of the amplifier MOSFETs MP1 and MN1 keeps the current balance correspondingly to the variation in the elements and the variation in the constant-current circuits I3 and I4 in a manner as described above.

In the circuit of the example shown in FIGS. 11 to 12, when it is required to suppress the effect of noise generated on the power-source voltage VDD and on ground potential GND of the circuit, the amplifier MOSFETs MP1, MN1 and MOSFET MN2 which constitutes a copied circuit, should be formed in the independent well regions as in the embodiment of FIG. 6, and the sources and the channels (back gates) should be connected in common.

Figure 13:
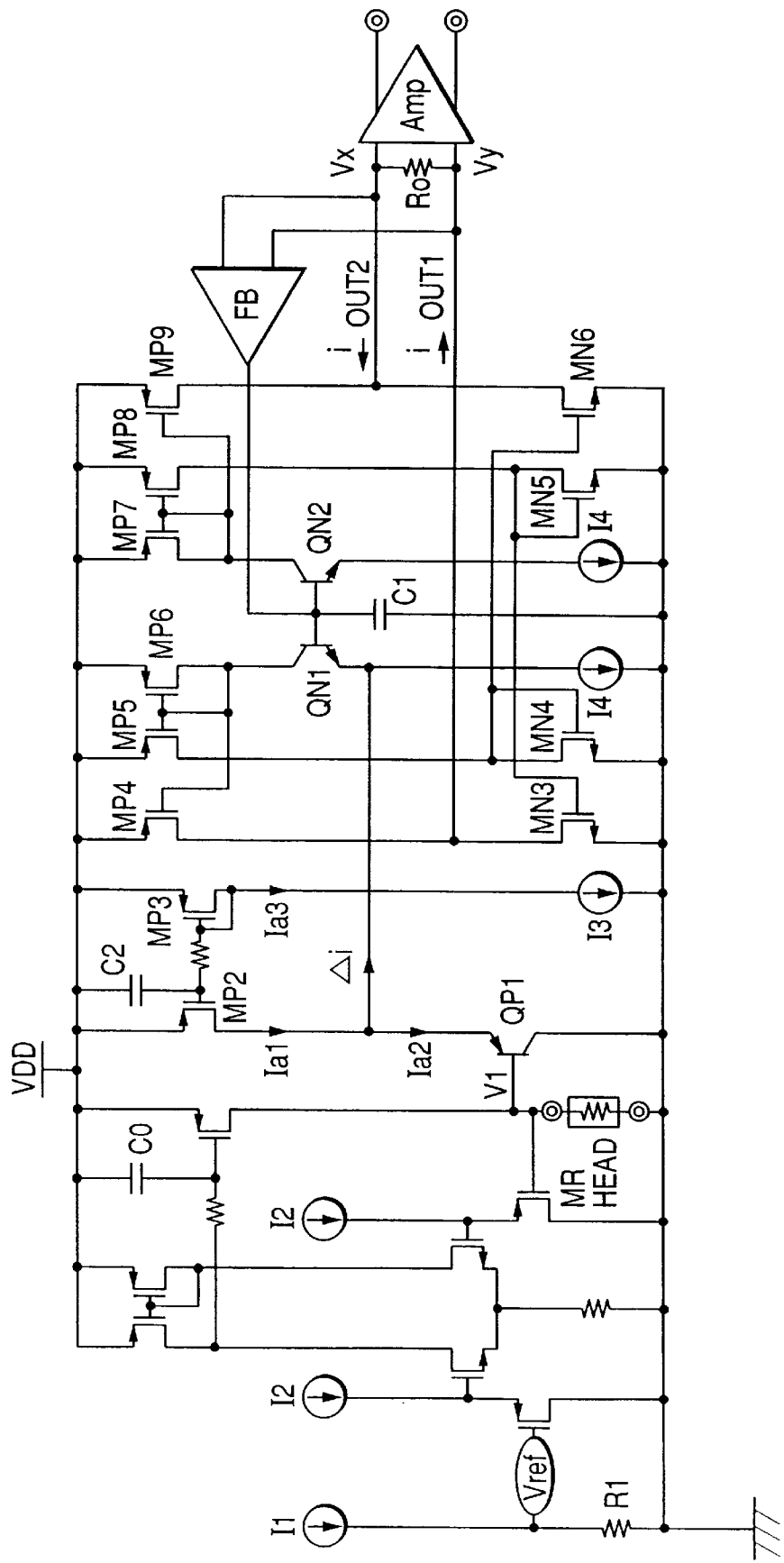
FIG. 13 is a circuit diagram illustrating a further example of the read system circuit which corresponds to FIG. 10.

FIG. 13 is a circuit diagram illustrating a further example of the read system circuit corresponding to FIG. 10. FIG. 13 shows a read amplifier, a first bias circuit for feeding a bias voltage to the read amplifier, a post-amplifier for amplifying a read current amplified by the read amplifier, and a second bias circuit for feeding a bias voltage to the MR head.

This example is basically the same as the example of FIG. 12 but uses bipolar PNP transistor QP1 and NPN transistor QN1 as amplifier elements. Corresponding thereto, therefore, the transistor constituting a copied circuit of the NPN transistor QN1 is a bipolar NPN transistor QN2. In this example as described above, only the amplifier elements QP1, QN1, and QN2 which is a copied circuit thereof are the bipolar transistors and other elements are MOSFETS. However, it is obvious that all elements may be bipolar transistors.

Figure 14:
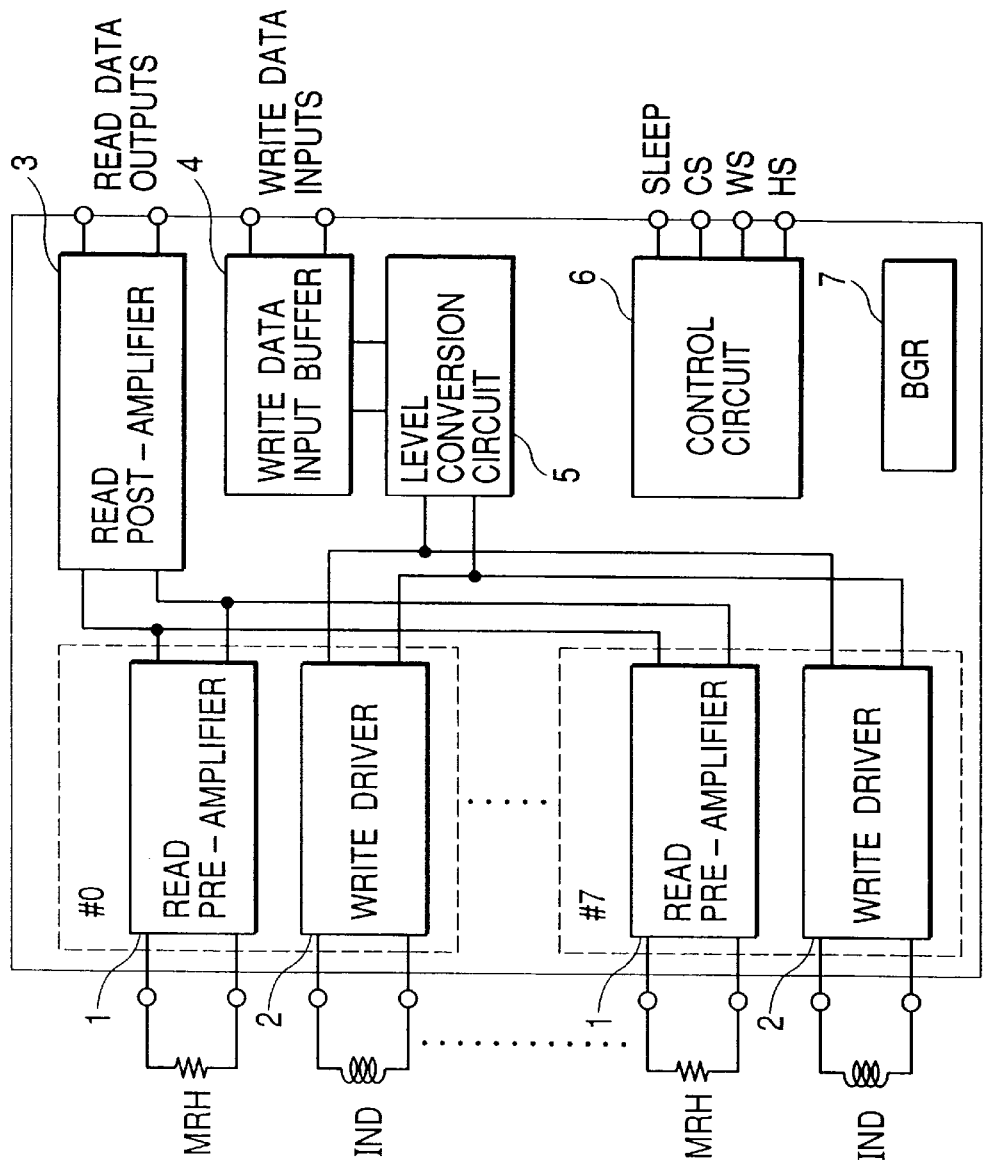
FIG. 14 is a block diagram illustrating an example of a read/write integrated circuit used for the magnetic disk storage apparatus according to the present invention.

FIG. 14 is a block diagram illustrating an example of the read/write integrated circuit used for the magnetic disk storage apparatus of the present invention. The read/write integrated circuit according to the present invention is constituted by a plurality of head circuits. That is, provision is made of a read amplifier 1 corresponding to an MR head MRH #0 and a read amplifiers 1 corresponding to seven other MR heads MRH #1 to #7. That is a total of eight circuits are mounted. There are further provided a total of eight magnetic heads IND for writing paired with the MR heads MRH. These magnetic heads IND are provided with write drivers in pairs. Eight read/write circuits #0 to #7 are provided.

A read post-amplifier 3 constituted by the CMA circuit and the amplifier output circuit, is provided as a post-amplifier for the eight read amplifiers 1 in common. Similarly, a write data input buffer 4 and a level conversion circuit 5 are provided for the eight write drivers 2. Provision is further made of a control circuit 6 and an error detector 7.

When the signal SLEEP is activated, the control circuit 6 shuts off the bias currents necessary to operate the circuits inclusive of the bias current for the read amplifier to establish a low-power-consumption mode. A signal CS is a chip selection signal, a signal WS is a mode-setting signal for designating read/write, and HS is a head selection signal. Though there is no particular limitation, the head selection signal HS is constituted by three bits and selects a head out of the eight heads.

The output units of the eight read amplifiers 1 each have an output selection function, the input units of the eight write drivers 2 each have an input selection function. A set of the output selection function of the read amplifier and the input selection function of the write driver is actuated by the head selection signal HS. Abnormal condition or breakage of line in the magnetic heads for writing, is detected by the error detector circuit 7 connected to the level conversion circuit 5 and to the read post-amplifier 3 provided in common for these circuits.

Figure 15:
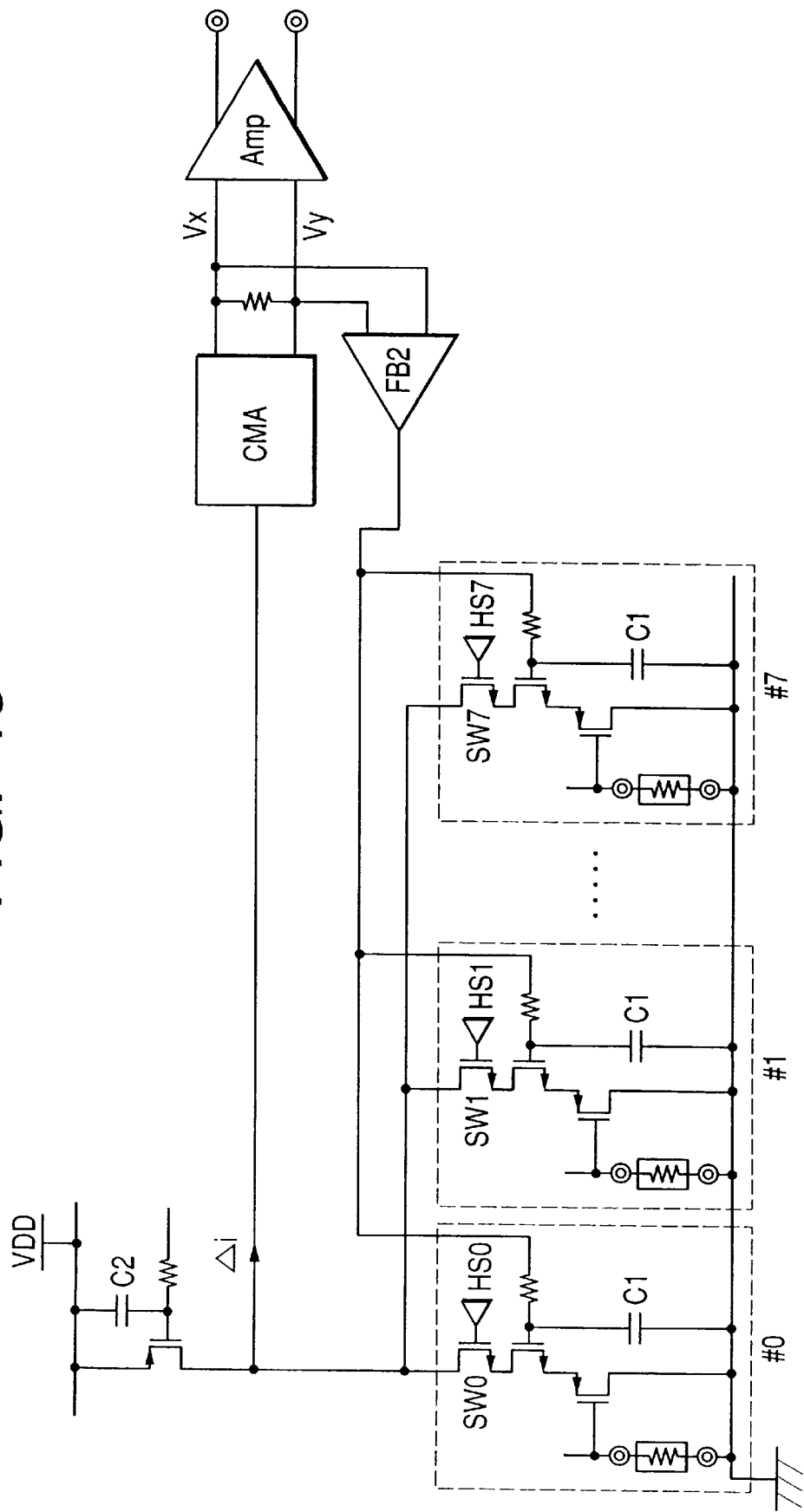
FIG. 15 is a circuit diagram illustrating an example of a read post-amplifier provided in common to a plurality of read amplifiers corresponding to the read/write integrated circuit of FIG. 14.

FIG. 15 is a circuit diagram illustrating the relationship between the plurality of read amplifiers and the read post-amplifier provided commonly therefor of the one example. As the read amplifier, FIG. 15 representatively shows amplifier MOSFETs in the modified differential form, and N-channel switching MOSFETs SW0 to SW7 for selecting the amplifier MOSFETs. In FIG. 15, eight read amplifiers are provided corresponding to #0 to #7 according to the above-mentioned embodiment. The selection signals HS0 to HS7 generated by the control circuit are supplied to the gates of the switching MOSFETs corresponding to the circuits #0 to #7, and selected one is turned on.

A load circuit is provided in common via the switching MOSFETs. A read current signal Δi formed by the selected set of modified differential MOSFETs and the load circuit, is output through the CMA circuit that constitutes the read post-amplifier and the amplifier output circuit Amp.

The feedback amplifier FB2 for compensating the offset generates a feedback signal by which the DC output voltage of the CMA circuit becomes zero, and the feedback signal is transmitted to the gate of the N-channel amplifier MOSFETs supplied with the modified differential bias voltage. Actually, the bias voltage-generating circuit in the form of a mirror circuit as described above is provided for each of the circuits #0 to #7, the output current of the feedback amplifier FB2 is supplied to these bias voltage circuits, and the above-mentioned eight read amplifiers are compensated for their offset simultaneously.

The output signal of an amplifier MOSFET is transmitted to the CMA circuit by the switching MOSFET, making it possible to execute the offset compensation for a read amplifier that is selected. However, the eight read amplifiers provided in the semiconductor integrated circuit device produce small differences in the relative offset. Therefore, the offset voltage generated when the switch is changed over is low, and the feedback amplifier FB2 compensates the offset voltage for a change-over of the switch with a good response.

Figure 16:
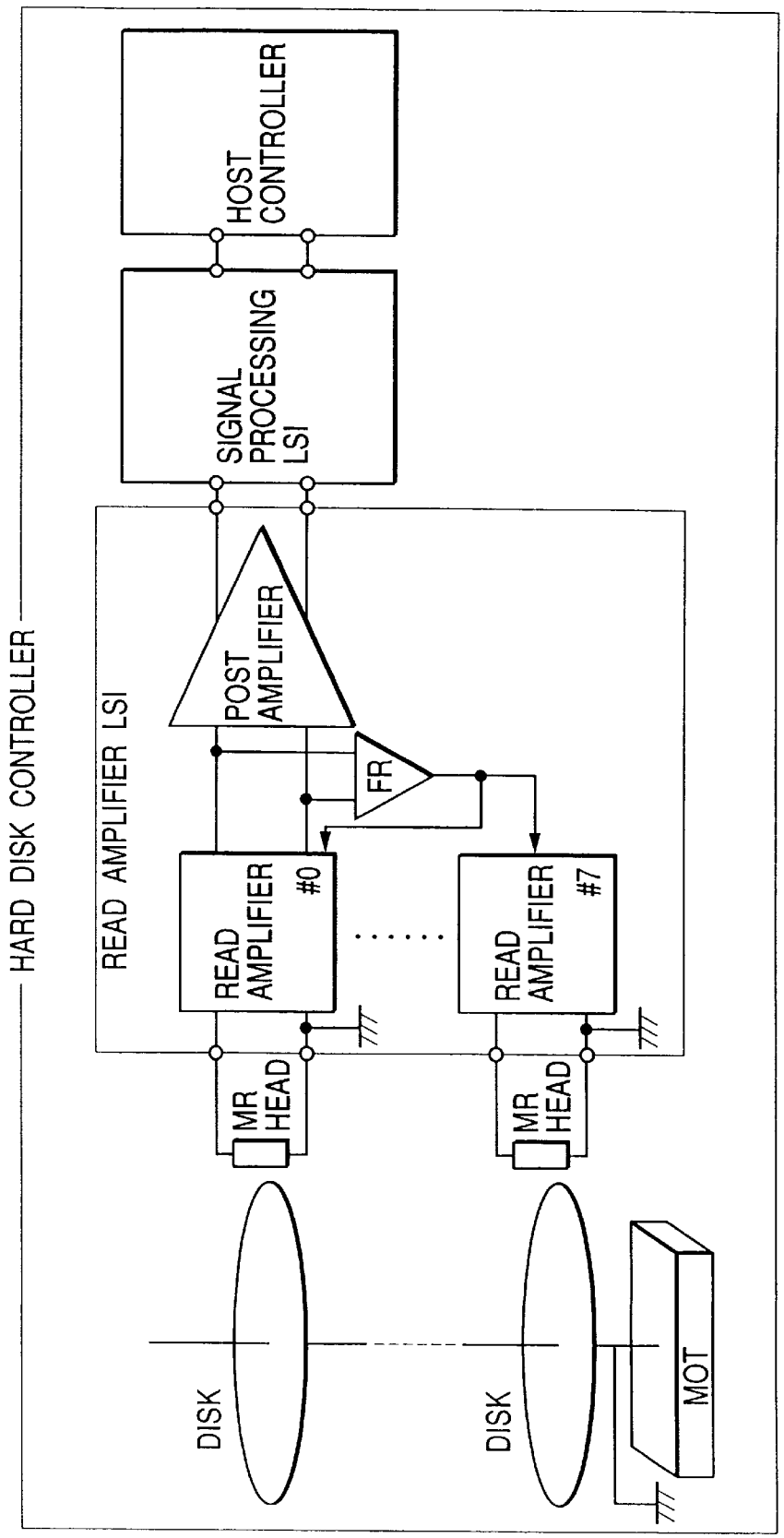
FIG. 16 is a block diagram illustrating an example of a hard disk device according to the present invention.

FIG. 16 is a block diagram schematically illustrating an embodiment of a hard disk unit according to the present invention. The hard disk unit according to the present invention is constituted by a plurality of disks which are storage media, a motor for driving these disks, a plurality of MR heads for reading magnetically recorded information stored in the disks, a plurality of read amplifiers so provided as to correspond to the MR heads, a read amplifier LSI equipped with a post-amplifier, a signal processing LSI which receives output signals from the read amplifier LSI and processes them to generate digital signals that can be used for a host controller such as personal computer, and an interface with the host controller. Actually, the magnetic recording surfaces are formed on the front surface and on the back surface of the disks in order to increase the storage capacity. Therefore, the MR heads are so provided as to correspond to both surfaces of the disks.

The disks are mounted at their centers on a common rotary shaft that is rotated by the motor. Ground potential is applied to the rotary shaft, so that the storage surfaces of the plurality of disks assume the ground potential. In FIG. 16, the write system circuits for read amplifier LSI and the corresponding magnetic heads for writing are not shown.

The above-mentioned constitution in which eight read amplifiers are provided for one read amplifier LSI can be applied to the one having a maximum of four disks in a system in which one head is provided for a recording surface. In a system having more disks, a plurality of read amplifiers LSI are provided and connected in parallel with the signal processing LSI as will be described later, and the one selected by the chip selection signal CS is substantially connected to the signal processing LSI.

When a plurality of read amplifiers LSI are mounted in order to increase the storage capacity of the hard disk unit, the post-amplifiers that produce corresponding post-amplifier outputs are connected in common to the output terminals of post-amplifiers of other read amplifiers LSI. In order that the output signal only of a read amplifier LSI selected by the chip selection signal is transmitted to an AGC amplifier through the capacitor, the post-amplifier has a three-state output function inclusive of a high output impedance. In other words, the output of the post-amplifier of the read amplifier LSI that is placed in a non-selected state assumes a high-impedance state, so that the output signal of the post-amplifier of the selected read amplifier LSI only is made effective.

Write data are supplied from the host controller to the write data input buffer included in the read amplifier LSI through a write system circuit included in the signal processing LSI. The write data are inputted to a frequency-dividing circuit for receiving data. The output signal of the frequency-dividing circuit is commonly transmitted to the inputs of a plurality of write drivers, and a write driver selected by a selection signal is operated to drive the magnetic head in order to execute the writing operation.

Figure 17:
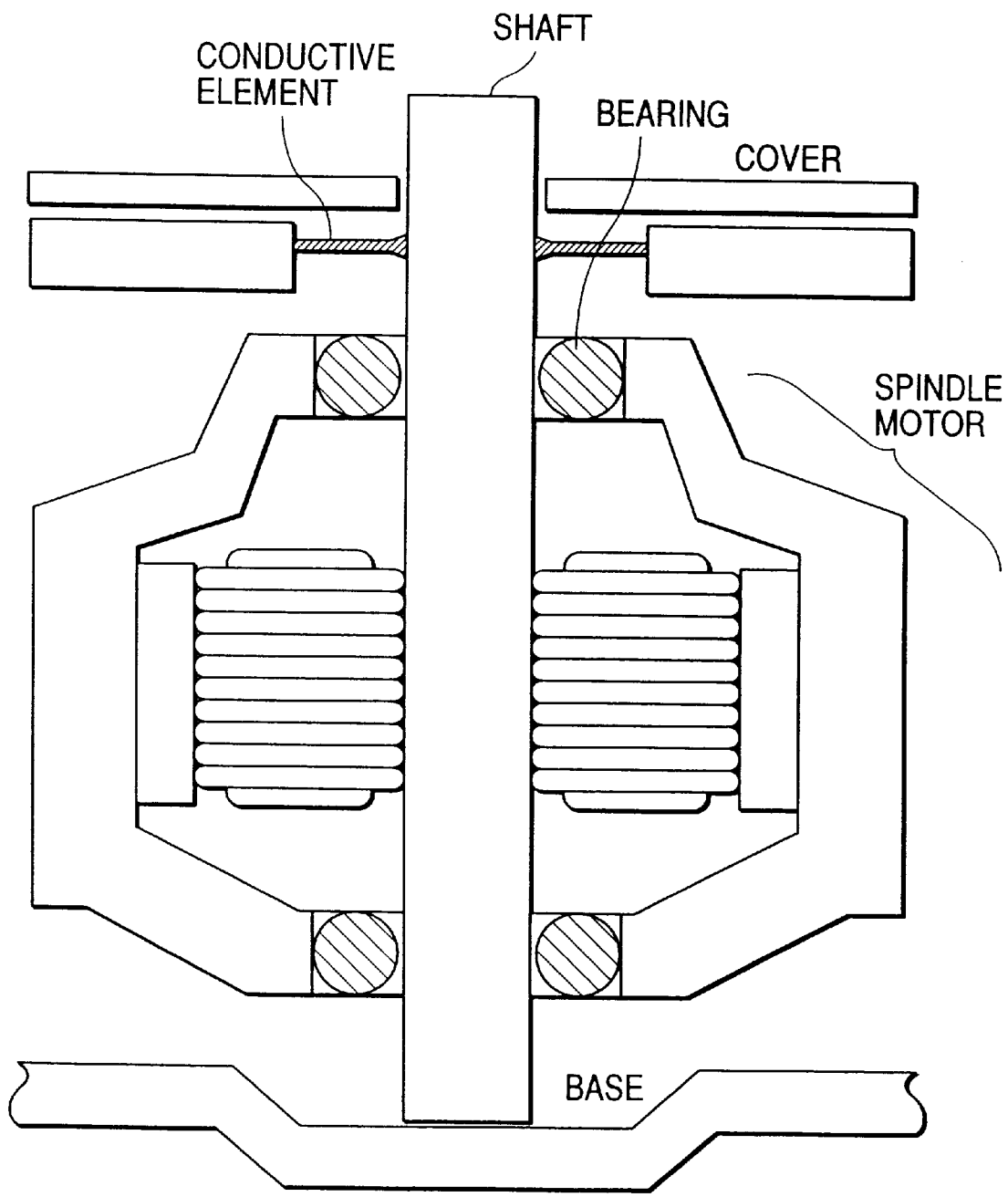
FIG. 17 is a sectional view schematically illustrating an example of a disk drive mechanism used in the magnetic disk storage apparatus according to the present invention.

FIG. 17 is a sectional view schematically illustrating an example of a disk drive mechanism. The shaft of a spindle motor is made of an electrically conductive metal and is provided with a brush-like conductive member to impart the ground potential to the shaft. The conductive member comes into contact with the surface of the shaft to supply the ground potential of the circuit. A plurality of disks are mounted on the shaft, and the ground potential is applied to the magnetic members formed on the front surfaces and on the back surfaces thereof. Upon supplying the ground potential, the electric charge stored in the disk can be extracted. Besides, the ground potential is applied to one end of the MR head to prevent electric discharge between the two.

Figures 18A, 18B:
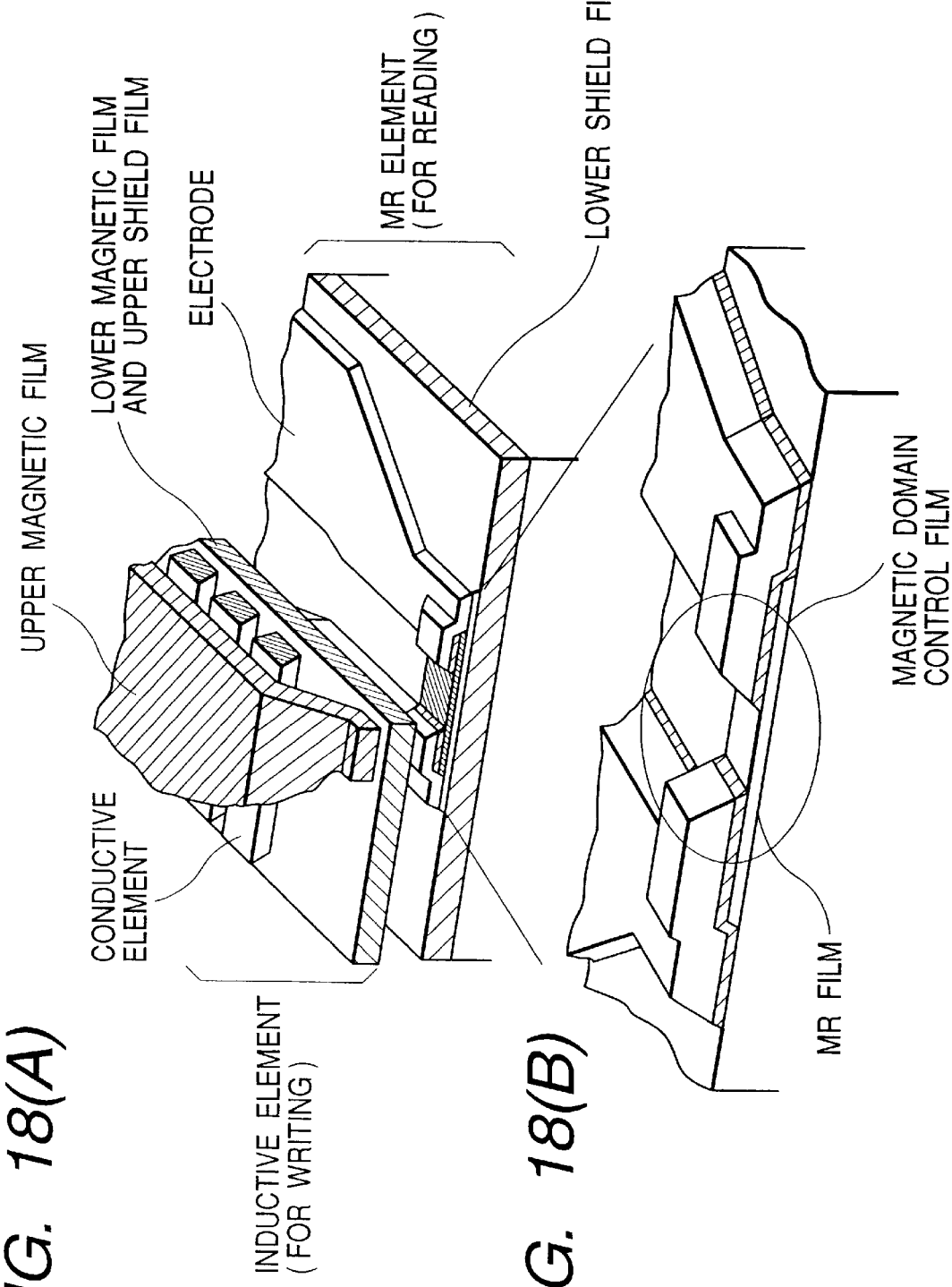
FIG. 18 is a diagram illustrating, partly in cross section, the appearance of an example of an MR/inductive composite head used in the magnetic disk storage apparatus according to the present invention.

FIG. 18 is a diagram illustrating the appearance, partly in cross section, of an example of an MR-inductive composite head. FIG. 18(A) is a view illustrating the entire of the two elements, and FIG. 18(B) is a diagram illustrating the MR element on an enlarged scale. In FIG. 18(A), the inductive element is used for writing, and is constituted by an upper magnetic film, a lower magnetic film also serving as an upper shield film, and a conductor sandwiched between these two magnetic films.

The MR element is formed on the wafer by microfabrication technology such as for semiconductor device, and the MR film is so formed on the lower shield film as to be sandwiched by two electrodes. As shown in the enlarged diagram (B), a magnetic domain control film is provided between the MR film and the electrodes. Though not shown, a shunt film and an SAL (soft adjacent layer) film are formed under the MR film.

Due to a high-speed air stream generated by a high-speed revolution of the disk, the composite head is lifted by a very small distance (e.g., several nanometers to several tens of nanometers) from the disk. The disk rotates at a high speed with a distance which is extremely small and consequently can be regarded to be almost in contact with the head, and the MR head moves to change the position according to the track address. Accordingly, the disk and the MR head are not spaced at a very small distance at all times, but actually come in contact with each other many times during the operation. If the potential of the MR head is different from the potential of the disk at the time when the head comes in contact with the surface of the disk, a short-circuit current flows when they come into contact, destroying the MR head, or, though the MR head may not be destroyed, the characteristics of the MR head are deteriorated, or a discharge current at the time of reading the data turns into undesirable noise.

In this embodiment, the disk and the MR head are held at the same ground potential in order to prevent electric discharge that might be caused when they have dissimilar potentials. Theoretically, the electric discharge does not take place when the two have the same potential. That is, theoretically, an intermediate voltage may be applied to the disk. In order to apply a stable bias voltage within a short period of time when the power supply is started or in order to quickly extract the electric charge accumulated in the magnetic surface due to high-speed revolution, however, a bias voltage for the extraction must be formed by a power supply having a low impedance. However, the power supply unit having a low impedance is complex and is not practicable.

Therefore, the ground potential of a simple circuit is utilized, which is most stable among the power supply voltages that the magnetic disk storage apparatus has, so that the burden on the power supply unit can be lightened. To constitute a highly sensitive read amplifier by using the ground potential of the circuit, the above-mentioned modified differential circuit is utilized, and a read signal of a low voltage close to the ground potential of the circuit and of a small amplitude is highly sensitively sensed using a single power supply.

Figure 19:
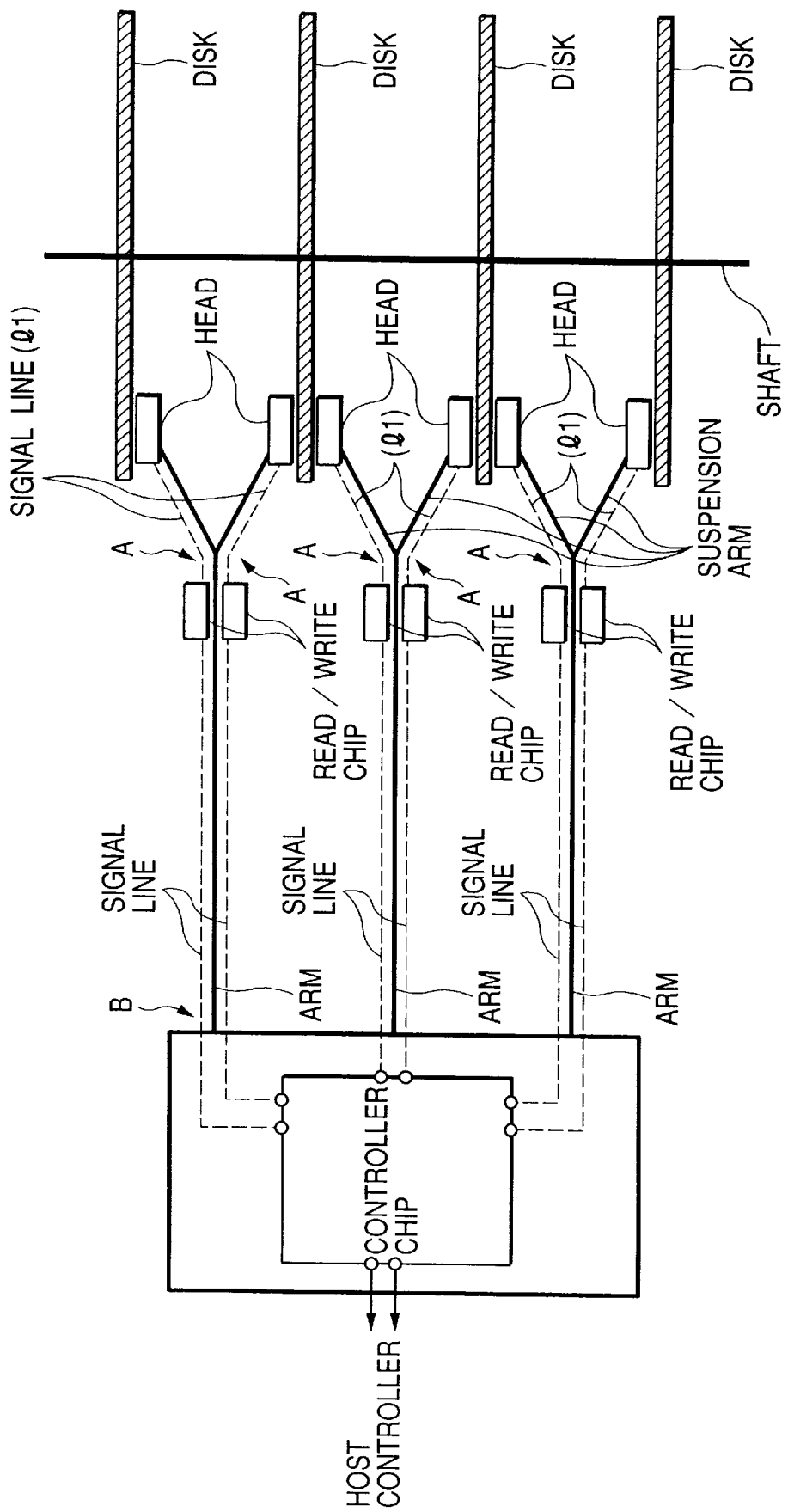
FIG. 19 is a diagram of constitution, for schematically illustrating an example of the hard disk device according to the present invention.

FIG. 19 is a diagram schematically illustrating the constitution of an embodiment of the hard disk unit according to the present invention. In this embodiment, a plurality of disks are coupled together concentrically by a shaft at predetermined intervals. In this embodiment, one arm extends onto the surfaces of every two disks which are opposed to each other, and is branched to suspension arms, so that the composite heads are mounted in such a way as to be brought into contact with the two surfaces. When the disks are at a halt, the composite heads shown in FIG. 18 are in contact with the disk surfaces. In a state where the disks are rotating at high speed, however, the composite heads are floating with a very small gap due to the air stream produced by the high-speed revolution. The read/write operation is carried out in a state where the heads are floating above the disk surfaces.

In this embodiment, the read/write chip is mounted on an end of the arm, i.e., on a portion A where the suspension arm is attached. This makes it possible to shorten the plurality of signal wires 11 between the read/write chips and the heads, in other words, between the MR heads and the read preamplifiers, and between the magnetic heads and the write drivers, correspondingly to the lengths of the suspension arms. This also makes it possible to minimize the factors that attenuate signals, such as parasitic resistances and parasitic inductances of the signal wires and, hence, to realize the above-mentioned high sensitivity and wide-band operation.

The control chip for selecting one head out of a plurality of heads and the signal processing LSI are mounted on the other end B of the arm. The distance between the control chip and the read/write chip is relatively large correspondingly to the length of the arm. With the read/write chip being interposed, however, the signal component is so large that the signal loss can be neglected.

FIG. 20 is a diagram schematically illustrating the structure of essential portions of an embodiment of the hard disk unit according to the present invention. A read/write chip which includes at least the above-mentioned very-small-signal amplifier circuit and a write driver is mounted on the root A of the suspension arm. To the end of the suspension arm is attached a composite head constituted by the MR head and the magnetic head. A read signal from the MR head is amplified by the above-mentioned very-small-signal amplifier circuit, and the magnetic head is driven by the write driver.

Correspondingly to the plurality of disks, the plurality of arms and suspension arms are coupled together in an stacked state. The control chip is mounted by utilizing a side surface (on the other ends B of the arms) formed by the plurality of arms. With the read/write chips and the control chip being mounted as described above, the loss in the signal transmission path is minimized, and the reading operation is carried out with high sensitivity over a wide band, and the hard disk unit of a small size is realized.

FIG. 21 is a diagram of constitution, for illustrating the bias system of the MR element. In the bias system shown in FIG. 21, a bias current I is permitted to flow through the element, and the voltage drop (I×R) produced is sensed as a read voltage. This constitution corresponds to the embodiment of FIG. 8.

Figure 21A:
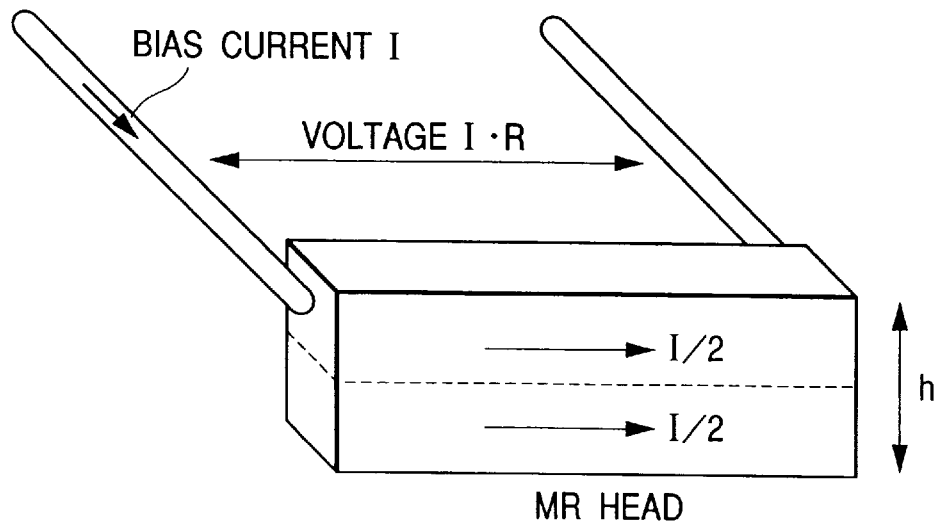
FIGS. 21(A) and 21(B) are diagrams of constitution, for illustrating the MR head bias system.
Figure 21B:
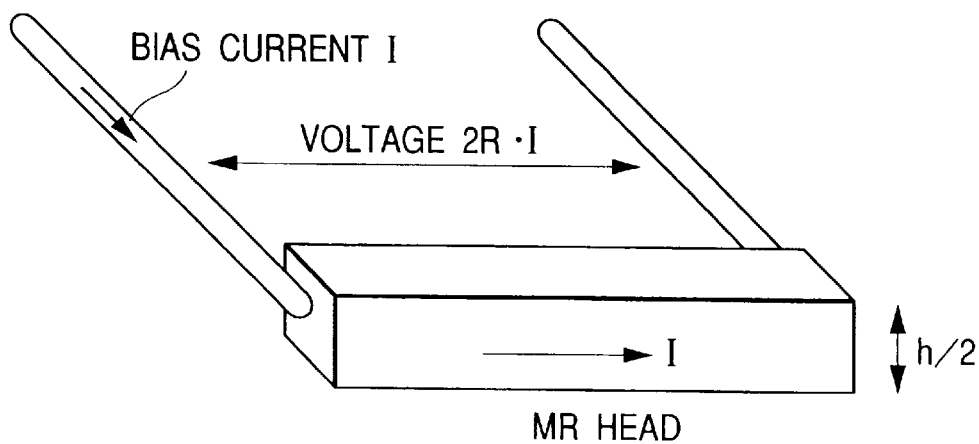

As described above, the disk and the MR head actually come into contact with each other many times, and it is considered that the height h of the MR film decreases from the one shown in FIG. 21(A) down to the one shown in FIG. 21(B) due to wear. Further, the height h itself may vary due to variation in the production. When the height h is small due to wear or due to variation in the production, the current density differs despite the same bias current I flows. That is, the density of current flowing through the MR head increases with a decrease in the height h.

The MR head is formed on the wafer by the microfabrication technology like semiconductor devices as described earlier. In order to ensure the life and reliability, migration of current and the like must be the same as those in semiconductor devices or must be more strictly controlled. In the above-mentioned current bias system, therefore, sufficient consideration must be given to the migration of current. Or, it can be said that the current bias system is suited for elements that are resistant to the wear.

Figure 22A:
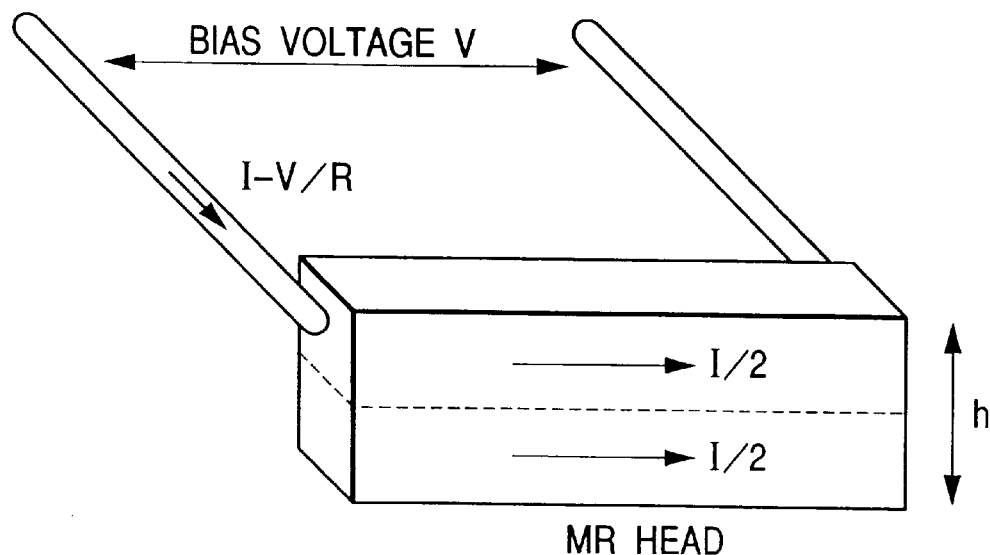
FIGS. 22(A) and 22(B) are diagrams of constitution, for illustrating another MR head bias system.
Figure 22B:
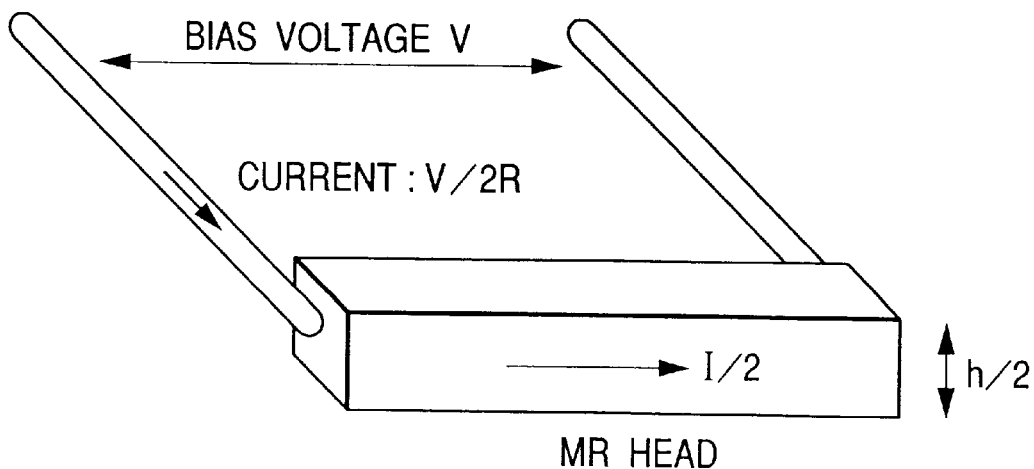

FIG. 22 is a diagram of constitution, for illustrating another bias system for the MR elements. In the bias system of FIG. 22, a bias voltage V is applied to the element and a current (V/R) that flows is used as a read signal. In this constitution, it is considered that the height h of the MR film decreases from the one shown in FIG. 22(A) down to the one shown in FIG. 22(B) due to wear. Or, the height h itself varies due to variation in the production. Due to the wear or variation in the production, nearly the same current flows irrespective of the height h. To ensure the life and reliability, therefore, no particular consideration is required concerning the migration of current.

When the current (V/R) is simply used as a read signal, however, the inductance component of the bonding wire that connects the MR head to the read amplifier (interior of the read/write IC), is connected in series. Accordingly, if the current flowing through the MR head is simply sensed, limitation or difficulty is imposed on reading the signals in the high-frequency region, which is not suited for the reading at a high storage density.

As in the embodiment of FIG. 1, therefore, the DC component only is fed back to apply the bias voltage to the MR head, and a voltage signal due to a change in the magnetoresistance generated in the MR head is amplified by the read amplifier, whereby the signals are not deteriorated by the inductance component of wires of the read/write IC in the high-frequency region, and the reading operation is executed over a wide band. The voltage can be read by the voltage bias system in the embodiments shown in FIGS. 2, 5, 6, 7 and 10 to 13, too.

The functions and effects produced by the above-mentioned embodiments will be described below.

(1) Use is made of a modified differential circuit including a first transistor of a first conductivity type and a second transistor of a second conductivity type each having a control terminal, a terminal on the input side and a terminal on the output side, wherein the terminals on the input side are connected in common, and a current corresponding to the voltage difference applied across the control terminals is allowed to flow, and wherein a very small voltage signal generated by an input signal source means is applied to the control terminal of said first transistor, a bias voltage is applied to the control terminal of the second transistor, and an amplified signal corresponding to the very small voltage signal generated by said input signal source means is generated from the terminal on the output side of the second transistor. Thus, a bias current is that is necessary for the first and second transistors is made to flow, and a very small voltage signal of the input signal source is directly amplified.

(2) The first transistor and the second transistor are bipolar transistors, the control terminal is a base terminal, the terminal on the input side is an emitter terminal, the terminal on the output side is a collector terminal, and the very small voltage signal smaller than a voltage across the base and emitter of the bipolar transistor is directly amplified to generate an amplified signal having a good S/N ratio.

(3) The first transistor and the second transistor are MOSFETs, the control terminal is a gate terminal, the terminal on the input side is a source terminal, the terminal on the output side is a drain terminal, and the very small voltage signal smaller than a voltage across the gate and source of the MOSFET is directly amplified to generate an amplified signal having a good S/N ratio.

(4) The input signal source means forms a voltage signal which includes a DC component with ground potential of the circuit as a reference potential, the terminal of the first transistor on the output side is connected to the ground potential of the circuit, and the terminal of the second transistor of the output side is provided with a first load element, making it possible to obtain a very-small-signal amplifier which operates on a single power source.

(5) The first bias circuit includes a third MOSFET of the first conductivity type and a fourth MOSFET of the second conductivity type constituting a circuit equivalent to a MOSFET of the first conductivity type which corresponds to the first transistor and a MOSFET of the second conductivity type which corresponds to the second transistor, and a second load element provided to the commonly connected gate and drain of the fourth MOSFET and constituting a circuit equivalent to the first load element provided to the drain of the MOSFET of the second conductivity type corresponding to the second transistor, wherein a DC voltage same as the DC voltage applied to the gate of the MOSFET corresponding to the first transistor is applied to the gate of the third MOSFET, a voltage at the gate terminal of the fourth MOSFET is used as a bias voltage and is applied, via a bias resistor, to the gate of a MOSFET that corresponds to the second transistor. By exploiting the feature of the pair of elements formed in the semiconductor integrated circuit, therefore, a desired bias voltage is generated.

(6) The first and second load elements provided for the drains of the amplifier MOSFET corresponding to the second transistor and of the fourth MOSFET are constituted by constant-current load circuits of current mirror circuits that receive a reference constant current. By exploiting the feature of the pair of elements formed in the semiconductor integrated circuit, therefore, a bias voltage is generated.

(7) Provision is further made of a current mode amplifier circuit which converts the current signal components taken out from the drain of a MOSFET corresponding to the second transistor into amplified differential current signals having phases opposite to each other, and a DC feedback amplifier which senses the difference in the DC voltage across a pair of output terminals of the current mode amplifier circuit, and adjusts the bias voltage applied to the gate of the MOSFET corresponding to the second transistor via the fourth MOSFETs so that the difference in the DC voltage becomes zero. Therefore, favorable amplified signals capable of compensating even variation in the process for producing the pair of elements.

(8) A first current-source circuit is provided to a terminal of the first transistor on the input side to set a direct current that flows through the first transistor, and a second current-source circuit is provided to the input terminal of the second transistor to set a direct current that flows through the second transistor, whereby a required bias current is supplied to the first and second transistors, and a very small voltage signal of the input signal source is directly amplified.

(9) The first and second transistors are bipolar transistors, the control terminal is a base terminal, the terminal on the input side is an emitter terminal, the terminal on the output side is a collector terminal, and the very small signal smaller than the voltage across the base and the emitter of the bipolar transistor is directly amplified to generate an amplified signal having a good S/N ratio.

(10) The first and second transistors are MOSFETS, the control terminal is a gate terminal, the terminal on the input side is a source terminal, the terminal on the output side is a drain terminal, and the very small signal smaller than the voltage across the gate and the source of the bipolar transistor is directly amplified to generate an amplified signal having a good S/N ratio.

(11) The input signal source means generates a voltage signal containing a DC component with the ground potential of the circuit as a reference potential, the drain terminal of the MOSFET corresponding to the first transistor is connected to the ground potential of the circuit, the source terminal thereof is connected to an output terminal of a current mirror circuit that constitutes the first current source circuit, the source terminal of the MOSFET corresponding to the second transistor is connected to the second current source circuit, the drain terminal thereof is provided with a first current mirror circuit that produces first and second amplified currents corresponding to the current that flows through the drain of the MOSFET, a fifth MOSFET is provided whose gate is connected in common to the gate of the MOSFET that corresponds to the second transistor, the source of the fifth MOSFET is connected to a third current source circuit equivalent to the second current source circuit, the drain terminal thereof is provided with a second current mirror circuit that produces third and fourth amplified currents amplified equally to the first and second amplified currents and corresponding to the current that flows through the drain of the fifth MOSFET, and a third current mirror circuit is provided to combine the first to fourth amplified currents together thereby to generate current signals of opposite phases to each other. Thus, there is provided a very-small-signal amplifier which operates on a single power source and effects amplification operation without being affected by the power-source voltage.

(12) Current signals of opposite phases outputted from the third current mirror circuit are fed to resistive elements provided for the first and second output terminals so as to be converted into voltage signals, and a DC feedback amplifier is further provided to sense DC voltages generated across the resistive elements and to feed them back to said first current-source circuit so that the DC voltages become zero.

(13) Current signals of opposite phases outputted from the third current mirror circuit are fed to resistive elements provided to the first and second output terminals so as to be converted into voltage signals, a DC feedback amplifier is further provided to sense DC voltages generated across the resistive elements and to feed them back to the bias voltage of the MOSFET corresponding to the second transistor so that the DC voltages become zero, and the DC feedback amplifier is used as the first bias circuit. Therefore, very small signals can be amplified compensating even variation in the process for producing the pair of elements.

(14) A magnetic disk storage apparatus comprising a disk-like magnetic storage medium impressed with a first potential to discharge static electricity generated by the rotational operation, a read head using a magnetoresistance effect element which is supplied at its one end with the first potential and outputs a read signal from the other end thereof, and a very-small-signal amplifier circuit for amplifying a read signal generated by the read head, wherein the very-small-signal amplifier circuit is a modified differential circuit including a first transistor of a first conductivity type and a second transistor of a second conductivity type each having a control terminal, a terminal on the input side and a terminal on the output side, in which the terminals of the input side are connected in common, and a current is allowed to flow depending upon the voltage difference across the control terminals, and wherein a very small voltage signal formed by the read head is applied to the control terminal of the first transistor, a bias voltage is applied to the control terminal of the second transistor, and an amplified signal corresponding to the very small voltage signal is generated from the terminal of the second transistor on the output side. This makes it possible to realize the reading operation with high sensitivity over a wide band of up to high frequencies while simplifying the circuit.

(15) The first transistor and the second transistor are bipolar transistors, the control terminal is a base terminal, the terminal on the input side is an emitter terminal, the terminal on the output side is a collector terminal, and the very small voltage signal is directly amplified. This makes it possible to realize the reading operation with high sensitivity over a wide band of up to high frequencies while simplifying the circuit.

(16) The first transistor and the second transistor are MOSFETs, the control terminal is a gate terminal, the terminal on the input side is a source terminal, the terminal on the output side is a drain terminal, and the very small voltage signal is directly amplified. This makes it possible to realize the reading operation with high sensitivity over a wide band of up to high frequencies while simplifying the circuit.

(17) A second bias circuit for generating a bias voltage applied to the other end of the magnetoresistance effect element includes a voltage comparator circuit that receives a reference voltage and a voltage from the other end of the magnetoresistance effect element, and a MOSFET of the first conductivity type which receives the output signal of the voltage comparator circuit and supplies a direct current for bringing the voltage at the other end of the magnetoresistance effect element into agreement with the reference voltage. A voltage signal is read while applying a bias voltage to the MR head, thereby to effect reading operation over a wide band for a long life with high reliability.

(18) The first bias circuit includes a third MOSFET of the first conductivity type and a fourth MOSFET of the second conductivity type equivalent to the amplifier MOSFET of the first conductivity type and the amplifier MOSFET of the second conductivity type, and a mirror circuit constituted by a second load circuit equivalent to the first load circuit by commonly connecting the gate and drain of the fourth MOSFET, wherein the reference voltage is applied to the gate of the third MOSFET, and a gate voltage of the fourth MOSFET is applied to the gate of the second amplifier MOSFET through a bias resistor, making it possible to form a stable bias voltage supplied to the gate of the amplifier MOSFET of the second conductivity type.

(19) The MOSFETs corresponding to the first and second transistors, and the third and fourth MOSFETs are formed in electrically independent semiconductor wells, and the source potentials of the MOSFETs are used as bias voltages applied to the corresponding semiconductor wells. This makes it possible to execute a stable sensing operation without being affected by change or noise in the power-source voltage or in the ground potential of the circuit.

(20) The first and second load elements provided to the drains of the MOSFET corresponding to the second transistor and of the fourth MOSFET are constituted by constant-current load circuits of current mirror circuits that receive a reference constant current. By exploiting the feature of the pair of elements formed in the semiconductor integrated circuit, therefore, stable operation is accomplished using the bias current.

(21) Provision is further made of a current mode amplifier circuit which converts current signal taken out from the drain of the MOSFET corresponding to the second transistor into amplified differential current signals having phases opposite to each other, a feedback amplifier which detects a DC voltage across a pair of output terminals of the current mode amplifier circuit and feeds the DC voltage to the gate of the second amplifier MOSFET so that it becomes zero, and a capacitor for holding the bias voltage controlled through the feedback amplifier. This makes it possible to compensate the offset caused by the current amplification operation and variation in the pair of elements.

(22) The first load circuit is commonly provided, through selection switching MOSFETS, to the drains of a plurality of sets of first and second amplifier MOSFETs that constitute said plurality of very-small-signal amplifier circuits, the output current of a set of the second amplifier MOSFETs selected by the selection switching MOSFETs is fed to the current mode amplifier circuit, and a bias control signal formed by the feedback amplifier that detects a DC voltage across the output terminals of the current mode amplifier is commonly applied to the gates of the sets of the second amplifier MOSFETS. Thus, the read amplifier effects the amplification and the compensation of the offset, while simplifying the circuit.

(23) A plurality of disk-like magnetic storage media impressed with a first potential for discharging static electricity generated by the rotational operation are concentrically mounted on a rotary drive mechanism so that the ground potential is supplied as said first potential, provision is made of a plurality of read heads constituted by magnetoresistance effect elements each having an end coupled to the ground potential of the circuit and another end for reading storage signals from the corresponding storage medium, and provision is further made of a plurality of the very-small-signal amplifier circuits for amplifying read signals from the corresponding read heads constituted by the magnetoresistance effect elements. This makes it possible to provide a magnetic disk storage apparatus of a small size having a large storage capacity with high reliability, enabling the reading over a wide band.

(24) As the rotary drive mechanism, an electrically conductive shaft is provided with a brush-like electrically conductive member which sets the same potential as the ground potential of the circuit, the electrically conductive shaft mounted with the plurality of storage media and rotated by a spindle motor. This makes it possible to provide a magnetic disk storage apparatus of a small size having a large storage capacity and a high reliability, enabling the reading over a wide band.

(25) The read heads constituted by the magnetoresistive elements for reading stored signals from the corresponding storage media, constitute composite heads together with inductive heads that store the signals in the corresponding storage media. This makes it possible to provide a magnetic disk storage apparatus of a small size having a large storage capacity and a high reliability, enabling the reading over a wide band.

(26) The terminal on the input side of the first transistor for amplifying the read signal from the MR head is provided with a first power-source circuit for setting a direct current that flows through the first transistor, and the input terminal of the second transistor is provided with a second current-source circuit for setting a direct current that flows through the second transistor. Thus, required bias currents are supplied to the first and second transistors, a very small voltage signal of the input signal source is directly amplified, and the reading operation is realized with a high sensitivity over a wide band of up to high frequencies, while simplifying the circuit.

(27) The drain terminal of a MOSFET corresponding to the first transistor is connected to the ground potential of the circuit, the source terminal thereof is connected to the output terminal of a current mirror circuit that constitutes the first power-source circuit, the source terminal of a MOSFET corresponding to the second transistor is connected to the second current-source circuit, the drain terminal thereof is provided with a first current mirror circuit that produces first and second amplified currents corresponding to the currents flowing through the drain of the MOSFET, a fifth MOSFET having a gate connected in common to the gate of the MOSFET corresponding to the second transistor is provided, the source of the fifth MOSFET is connected to a third current-source circuit equivalent to the second current-source circuit, the drain terminal thereof is provided with a second current mirror circuit which produces third and fourth currents equally amplified as the first and second amplified currents depending upon a current that flows through the drain of the fifth MOSFET, and a third current mirror circuit is provided to combine the first to fourth amplified currents together in order to form current signals of phases opposite to each other. By using the read amplifier which operates on a single power supply and executes amplification operation without being affected by the power supply voltage, it is possible to realize reading operation with high sensitivity over a wide band of up to high frequencies, while simplifying the circuit.

(28) Current signals of opposite phases outputted from the third current mirror circuit are fed to the resistive elements provided at the first and second output terminals, and converted into voltage signals, and provision is further made of a DC feedback amplifier which detects DC voltages generated across the resistive elements and sends the DC voltages back to the first current-source circuit so that they become zero. This makes it possible to realize reading operation with high sensitivity over a wide band of up to high frequencies, while simplifying the circuit.

In the foregoing the invention accomplished by the present inventors has been described by way of embodiments. It should, however, be noted that the present invention is in no way limited to the above-mentioned embodiments only but can be modified in a variety of ways without departing from the spirit and scope of the invention. For instance, the circuit for feeding DC bias voltages to the MR heads, circuits for feeding DC bias voltages to the modified differential amplifier MOSFETs or the amplifier transistors, and the CMA circuit may be constituted in a variety of other ways. The MR heads may be constituted in various other ways in addition to those described in the foregoing embodiments.

In addition to those for amplifying very small signals from the MR heads, the present invention can be extensively utilized for very-small-signal amplifier devices inclusive of the input signal sources for generating very small signals smaller than the voltage across the base and the emitter of the amplifier transistor that includes a DC component like that of MR heads, and than the threshold voltage between the gate and the source of the amplifier MOSFET.

The effects produced by representatives of the invention disclosed in this application will be briefly described. That is, use is made of a modified differential circuit comprising a first transistor of a first conductivity type and a second transistor of a second conductivity type each having a control terminal, a terminal on the input side and a terminal on the output side, wherein the terminals on the input side are connected in common, and a current corresponding to the voltage difference applied across the control terminals is allowed to flow, and wherein a very small voltage signal generated by an input signal source means is applied to the control terminal of the first transistor, a bias voltage is applied to the control terminal of the second transistor, and an amplified signal corresponding to the very small voltage signal generated by the input signal source means is generated at the terminal on the output side of the second transistor. Thus, a bias current is supplied that is necessary for the first and second transistors, and a very small voltage signal of the input signal source is directly amplified.

A magnetic disk storage apparatus comprising a disk-like magnetic storage medium supplied with a first potential to discharge static electricity generated by the rotational operation, a read head using a magnetoresistance effect element which is supplied at its one end with the first potential and outputs a read signal from the other end thereof, and a very-small-signal amplifier circuit for amplifying a read signal generated by said read head, wherein the very-small-signal amplifier circuit is a modified differential circuit comprising a first transistor of a first conductivity type and a second transistor of a second conductivity type each having a control terminal, a terminal on the input side and a terminal on the output side, in which the terminals on the input side are connected in common, and a current corresponding to the voltage difference applied across the control terminals is allowed to flow, and wherein a very small voltage signal generated by the read head is applied to the control terminal of the first transistor, a bias voltage is applied to the control terminal of the second transistor, and an amplified signal corresponding to the very small voltage signal is generated at the terminal of the second transistor on the output side. This makes it possible to realize the reading operation with high sensitivity over a wide band of up to high frequencies while simplifying the circuit.

What is claimed is:

1. A magnetic disk storage apparatus comprising:
   a disk-like magnetic storage medium supplied with a first potential and storing information thereon;
   a read head using a magnetoresistance effect element which is used for reading said information on said disk-like magnetic storage medium and which is supplied at its one end with said first potential and outputs a read signal from the other end thereof;
   an amplifier circuit for amplifying said read signal formed by said read head; and
   a first bias circuit,
   wherein said amplifier circuit is a modified differential circuit including a first transistor of a first conductivity type and a second transistor of a second conductivity type each having a control terminal, a terminal on the input side and a terminal on the output side, in which the terminals on the input side are connected in common, and a current corresponding to the voltage difference across the control terminals is allowed to flow, wherein said first potential is applied to the output terminal of said first transistor, and said read signal generated by said read head is applied to said control terminal of said first transistor, wherein a bias voltage generated by the first bias circuit is applied to said control terminal of said second transistor, and wherein an amplified signal corresponding to said read signal is generated from the terminal of said second transistor on the output side.

2. A magnetic disc storage apparatus according to claim 1, wherein said first transistor and said second transistor are bipolar transistors, said control terminal is a base terminal, the terminal on the input side is an emitter terminal, and the terminal on the output side is a collector terminal.

3. A magnetic disk storage apparatus according to claim 2, wherein said first transistor and said second transistor are MOSFETs, said control terminal is a gate terminal, the terminal on the input side is a source terminal, and the terminal on the output side is a drain terminal.

4. A magnetic disk storage apparatus according to claim 3, further comprising:

a second bias circuit for generating a bias voltage applied to the other end of said magnetoresistance effect element, wherein said second bias circuit includes:
 a voltage comparator circuit that receives a reference voltage and the voltage from the other end of said magnetoresistance effect element; and
 a MOSFET of the first conductivity type which receives the output signal of the voltage comparator circuit and supplies a direct current for bringing the voltage at the other end of the magnetoresistance effect element into agreement with said reference voltage.

5. A magnetic disk storage apparatus according to claim 4, further comprising:

a first load element provided to the drain of the MOSFET of the second conductivity type corresponding to said second transistor, wherein said first bias circuit includes:
 a third MOSFET of the first conductivity type and a fourth MOSFET of the second conductivity type equivalent to the MOSFET of the first conductivity type corresponding to said first transistor and the MOSFET of the second conductivity type corresponding to said second transistor, respectively; and
 a second load element provided to the commonly connected gate and drain of said fourth MOSFET and constituting a circuit equivalent to said first load element;
 wherein said reference voltage is applied to the gate of said third MOSFET, and the gate voltage of said fourth MOSFET is applied as a bias voltage to the gate of the MOSFET corresponding to said second transistor through a bias resistor.

6. A magnetic disk storage apparatus according to claim 5, wherein the MOSFETs corresponding to said first and second transistors, and said third and fourth MOSFETs are formed in electrically independent semiconductor wells, and the source potentials of said MOSFETs are applied as bias voltages to the corresponding semiconductor wells.

7. A magnetic disk storage apparatus according to claim 6, wherein the first and second load elements provided to the drains of the MOSFET corresponding to the second transistor and of the fourth MOSFET are constituted by constant-current load circuits of current mirror circuits that receive a reference constant current.

8. A magnetic disk storage apparatus according to claim 7, further comprising:

a current mode amplifier circuit which converts the current signal taken out from the drain of the MOSFET corresponding to the second transistor into amplified differential current signals having phases opposite to each other;

a feedback amplifier which senses a DC voltage across a pair of output terminals of the current mode amplifier circuit and feeds the DC voltage to the gate of the second amplifier MOSFET so that it becomes zero; and a capacitor for holding the bias voltage controlled through said feedback amplifier.

9. A magnetic disk storage apparatus according to claim 8, wherein said first load circuit is commonly provided through selection switching MOSFETs that are provided to the drains of said plural sets of first and second amplifier MOSFETs that constitute said plurality of amplifier circuits and to the drains of said plural sets of second amplifier MOSFETs, wherein the output current of a set of the second amplifier MOSFETs selected by the selection switching MOSFETs is fed to the current mode amplifier circuit that is used in common, and wherein a bias control signal formed by the feedback amplifier that senses the DC voltage across the output terminal of said current mode amplifier is commonly applied to the gates of the plural sets of said second amplifier MOSFETs.

10. A magnetic disk storage apparatus according to claim 9, wherein a plurality of disk-like magnetic storage media supplied with a first potential for discharging static electricity generated by the rotational operation are concentrically mounted on a rotary drive mechanism in such a way that the ground potential of the circuit is applied as said first potential, and wherein the magnetic disk storage apparatus further comprises:
 a plurality of read heads constituted by magnetoresistance effect elements each having an end coupled to the ground potential of the circuit and another end for reading storage signals from the corresponding storage media; and
 a plurality of the amplifier circuits for amplifying read signals from the corresponding read heads constituted by the magnetoresistance effect elements.

11. A magnetic disk storage apparatus according to claim 10, wherein said rotary drive mechanism includes:

a spindle motor;

an electrically conductive shaft for mounting said plurality of storage media which are turned by said spindle motor; and a brush-like electrically conductive member as means for setting said shaft to the same potential as the ground potential of the circuit.

12. A magnetic disk storage apparatus according to claim 11, wherein the read heads constituted by the magnetoresistance effect elements for reading stored signals from the corresponding storage media constitute composite heads together with inductive heads that store the signals in the corresponding storage media.

13. A magnetic disk storage apparatus comprising:
a disk-like magnetic storage medium supplied with a first potential and storing information thereon;
a read head using a magnetoresistance effect element which is used for reading said information on said disk-like magnetic storage medium and which is supplied at its one end with said first potential and outputs a read signal from the other end thereof;
an amplifier circuit for amplifying said read signal formed by said read head; and
a first bias circuit,
wherein said amplifier circuit is a modified differential circuit including a first transistor of a first conductivity type and a second transistor of a second conductivity type each having a control terminal, a terminal on the input side and a terminal on the output side, in which the terminals on the input side are connected in common, and a current corresponding to the voltage difference across the control terminals is allowed to flow,
wherein said first potential is applied to the output terminal of said first transistor, and said read signal generated by said read head is applied to said control terminal of said first transistor,
wherein a bias voltage generated by the first bias circuit is applied to said control terminal of said second transistor,
wherein an amplified signal corresponding to said read signal is generated from the terminal of said second transistor on the output side, and
wherein a terminal on the input side of said first transistor is provided with a first current-source circuit for setting a direct current that flows through the first transistor, and an input terminal of said second transistor is provided with a second current-source circuit for setting a direct current that flows through the second transistor.

14. A magnetic disk storage apparatus according to claim 13, wherein said first transistor and said second transistor are bipolar transistors, said control terminal is a base terminal, the terminal on the input side is an emitter terminal, and the terminal on the output side is a collector terminal.

15. A magnetic disk storage apparatus according to claim 13, wherein said first transistor and said second transistor are MOSFETs, said control terminal is a gate terminal, the terminal on the input side is a source terminal, and the terminal on the output side is a drain terminal.

16. A magnetic disk storage apparatus according to claim 15,
wherein said first potential is the ground potential of the circuit, and said read head generates a read signal containing a DC component with the ground potential of the circuit as a reference potential,
wherein the drain terminal of the MOSFET corresponding to said first transistor is connected to the ground potential of the circuit, the source terminal thereof is connected to the output terminal of a current mirror circuit that constitutes said first power supply circuit;
the source terminal of the MOSFET corresponding to said second transistor is connected to said second current-source circuit, the drain terminal thereof is provided with a first current mirror circuit that produces first and second amplified currents corresponding to the current flowing through the drain of the MOSFET;
a fifth MOSFET having a gate connected in common to the gate of the MOSFET which corresponds to the second transistor is provided;
the source of said fifth MOSFET is connected to a third current supply circuit equivalent to said second current-source circuit, the drain terminal thereof is provided with a second current mirror circuit which produces third and fourth currents equally amplified as said first and second amplified currents corresponding to the current that flows through the drain of the fifth MOSFET; and
a third current mirror circuit is provided to combine said first to fourth amplified currents together in order to generate current signals of phases opposite to each other.

17. A magnetic disk storage apparatus according to claim 16, wherein current signals of mutually opposite phases outputted from said third current mirror circuit are fed to the resistive elements provided at the first and second output terminals and converted into voltage signals, and provision is further made of a DC feedback amplifier which senses the DC voltages generated across the resistive elements and sends the DC voltages back to said first current-source circuit so that they become zero.

18. A magnetic disk storage apparatus according to claim 17, wherein a plurality of disk-like magnetic storage media supplied with a first potential for discharging static electricity generated by the rotational operation are concentrically mounted on a rotary drive mechanism so that the ground potential of the circuit is supplied as said first potential, and
wherein the magnetic disk storage apparatus further comprises:
a plurality of read heads constituted by magnetoresistance effect elements each having an end coupled to the ground potential of the circuit and another end for reading storage signals from the corresponding storage media; and
a plurality of the very-small-signal amplifier circuits for amplifying read signals from the corresponding read heads constituted by the magnetoresistance effect elements.

19. A magnetic disk storage apparatus according to claim 18, wherein said rotary drive mechanism includes:
a spindle motor;
an electrically conductive shaft for mounting said plurality of storage media which are turned by said spindle motor; and
a brush-like electrically conductive member as means for setting said shaft to the same potential as the ground potential of the circuit.

20. A magnetic disk storage apparatus according to claim 19, wherein the read heads constituted by the magnetoresistance effect elements for reading stored signals from the corresponding storage media constitute composite heads together with inductive heads that store the signals in the corresponding storage media.

21. A magnetic disk storage apparatus comprising:
a storage medium for storing information;
a drive unit rotating the storage medium and setting a potential of the storage medium with a first reference voltage;
a read head of a magnetoresistance effect element which is used for reading the information on the storage medium, the read head having a first end coupled to receive a first reference voltage and a second end for outputting a read signal representing the information on the storage medium; and a signal amplifier circuit including:

a load element having a first end coupled to receive a second reference voltage and a second end, a first MISFET of a first conductivity type having a gate terminal coupled to the second end of the read head, a drain terminal coupled to the first reference voltage, and a source terminal, a second MISFET of a second conductivity type different from the first conductivity type having a gate terminal, a drain terminal coupled to the second end of the load element and generating an amplified signal on the read signal, and a source terminal coupled to the source terminal of the first MISFET, and a first bias circuit providing a first bias voltage to the gate terminal of the second MISFET.

22. A magnetic disk storage apparatus according to claim 21, wherein the first reference voltage is a ground voltage.

23. A magnetic disk storage apparatus according to claim 22, further comprising:

a second bias circuit including:

a voltage comparator coupled to receive a third reference voltage and a voltage on the second end of the read head, and a third MISFET of the first conductivity type coupled to an output of the voltage comparator and providing a direct current to the second end of the read head so as to set a voltage on the second end of the read head to the third reference voltage.

24. A magnetic disk storage apparatus according to claim 22, further comprising:

a current amplifier coupled to receive the amplified signal and amplifying and providing complementary current signals.

25. A magnetic disk storage apparatus according to claim 22, wherein the signal amplifier circuit, the bias circuit and the current amplifier are formed on a semiconductor substrate.

26. A magnetic disk storage apparatus comprising:

a plurality of storage mediums storing information;

a drive unit rotating the plurality of storage medium and setting a potential of the plurality of storage medium with a first reference voltage;

a plurality of read heads of magnetoresistance effect elements, the plurality of read heads being used for reading the information on the plurality of storage mediums, each read head having a first end coupled to receive a first reference voltage and a second end for outputting a read signal representing the information; and an amplifier circuit including:

a load element having a first end coupled to receive a second reference voltage and a second end, a plurality of first MISFETs of a first conductivity type each having a gate terminal coupled to the second end of the corresponding read head, a drain terminal coupled to the first reference voltage, and a source terminal, a plurality of second MISFETs of a second conductivity type different from the first conductivity type each having a gate terminal, a drain terminal, and a source terminal coupled to the source terminal of the first MISFET, a plurality of selecting MISFETs each having a source-drain coupled between the second end of the load element and the drain terminal of the corresponding one of the plurality of second MISFETs, and gate coupled to receive a head selection signal, and a plurality of first bias circuits each providing a first bias voltage to the gate terminal of the corresponding one of the plurality of second MISFET, wherein an amplified signal on the read signal, which is generated from one read head selected by the head selection signal, is provided between the load elements and the selected one of the plurality of selecting MISFETs.

27. A magnetic disk storage apparatus according to claim 22, wherein the first reference voltage is a ground voltage.

28. A magnetic disk storage apparatus according to claim 26, wherein the amplifier circuit further comprises:

a plurality of second bias circuits each including:

a voltage comparator coupled to receive a third reference voltage and a voltage on the second end of the corresponding one of the plurality of read heads, and a third MISFET of the first conductivity type coupled to an output of the voltage comparator and providing a direct current to the second end of the corresponding one of the plurality of read heads so as to set a voltage on the second end of the read head to the third reference voltage.

29. A magnetic disk storage apparatus according to claim 28, wherein the amplifier circuit further comprises:

a current amplifier coupled to receive the amplified signal and providing amplified complementary current signals.

30. A magnetic disk storage apparatus according to claim 29, wherein the amplifier circuit is formed on a semiconductor substrate.

31. The magnetic disk storage apparatus according to claim 1, wherein the read head directly connected to said second transistor.

32. The magnetic disk storage apparatus according to claim 13, wherein the read head directly connected to said second transistor.

33. The magnetic disk storage apparatus according to claim 21, wherein the read head directly connected to said second MISFET.

* * * * *